United States Patent
Kim et al.

(10) Patent No.: US 12,354,540 B2
(45) Date of Patent: Jul. 8, 2025

(54) ELECTRONIC APPARATUS AND METHOD WHICH MAY IMPROVE PERFORMANCE OF SENSOR MODULE

(71) Applicant: SAMSUNG ELECTRONICS CO., LTD., Suwon-si (KR)

(72) Inventors: Youngdo Kim, Suwon-si (KR); Jongsik Kang, Suwon-si (KR); Gyudong Eom, Suwon-si (KR); Dongheon Shin, Suwon-si (KR); Namhyeon Jeon, Suwon-si (KR); Woonbo Yeo, Suwon-si (KR); Dongseop Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 126 days.

(21) Appl. No.: 18/458,601

(22) Filed: Aug. 30, 2023

(65) Prior Publication Data
US 2024/0282257 A1   Aug. 22, 2024

Related U.S. Application Data

(63) Continuation of application No. PCT/KR2022/002871, filed on Feb. 28, 2022.

(30) Foreign Application Priority Data

Mar. 5, 2021 (KR) .................. 10-2021-0029520
Dec. 31, 2021 (KR) .................. 10-2021-0194388

(51) Int. Cl.
   G09G 3/3225     (2016.01)
   G06V 40/13      (2022.01)
   H10K 59/00      (2023.01)

(52) U.S. Cl.
   CPC ....... G09G 3/3225 (2013.01); G06V 40/1318 (2022.01); G09G 2320/0626 (2013.01);
   (Continued)

(58) Field of Classification Search
   CPC ......... G09G 3/3225; G09G 2320/0626; G09G 2354/00; G09G 2360/14; G09G 2360/16;
   (Continued)

(56) References Cited

U.S. PATENT DOCUMENTS 10,248,834 B2    4/2019  Xu
2013/0321485 A1* 12/2013  Eom ................ G09G 3/3208
                                                   345/82

(Continued)

FOREIGN PATENT DOCUMENTS

JP    2014126699 A    7/2014
KR   20140021466 A    2/2014
(Continued)

OTHER PUBLICATIONS

International Search Report for PCT/KR2022/002871, mailed Jun. 3, 2022, 5 pages.

Primary Examiner — Dmitriy Bolotin
(74) Attorney, Agent, or Firm — Nixon & Vanderhye P.C.

(57) ABSTRACT

An electronic apparatus and/or method which may improve the performance of a sensor module. An electronic apparatus may include: a display panel; a fingerprint sensor arranged to overlap at least part of the display panel; and a processor operatively connected to the display panel and the fingerprint sensor, wherein the processor may: execute a fingerprint authentication function using the fingerprint sensor; identify an AMOLED off ratio (AOR) and luminance setting value of the display panel on the basis of the fingerprint authentication function being executed; linearly adjust the AOR according to a section to which the luminance setting value belongs or set the AOR to a designated minimum value; and perform fingerprint authentication by using the (Continued)

fingerprint sensor while the AOR is maintained at the minimum value. The present disclosure may further include various other embodiments.

20 Claims, 21 Drawing Sheets

(52) U.S. Cl.
CPC ..... *G09G 2354/00* (2013.01); *G09G 2360/14* (2013.01); *G09G 2360/16* (2013.01); *H10K 59/00* (2023.02)

(58) Field of Classification Search
CPC ...... G09G 5/10; G06V 40/1318; G06V 40/13; H10K 59/00
See application file for complete search history.

(56) References Cited

U.S. PATENT DOCUMENTS

| | | | |
|---|---|---|---|
| 2014/0176403 A1 | 6/2014 | Inoue et al. | |
| 2015/0156836 A1* | 6/2015 | Han | H05B 45/46 315/186 |
| 2016/0283772 A1 | 9/2016 | Nelson | |
| 2017/0242516 A1 | 8/2017 | Bae et al. | |
| 2017/0351364 A1 | 12/2017 | Kim et al. | |
| 2017/0364763 A1 | 12/2017 | Jin et al. | |
| 2018/0300526 A1* | 10/2018 | Cho | G06F 1/1626 |
| 2019/0080666 A1 | 3/2019 | Chappalli et al. | |
| 2019/0114458 A1 | 4/2019 | Cho et al. | |
| 2019/0294851 A1 | 9/2019 | Chung et al. | |
| 2020/0152724 A1* | 5/2020 | Cho | G06F 3/0412 |
| 2020/0242985 A1* | 7/2020 | Cho | G06F 1/1637 |
| 2021/0110132 A1* | 4/2021 | Cho | G06V 40/1318 |
| 2021/0248957 A1* | 8/2021 | Lee | G09G 3/3225 |
| 2022/0114956 A1* | 4/2022 | Lee | G09G 3/3225 |
| 2023/0016151 A1* | 1/2023 | Ko | G06V 40/1318 |
| 2023/0083516 A1* | 3/2023 | Choi | G09G 5/026 345/204 |
| 2023/0118391 A1* | 4/2023 | Choi | H04M 1/026 345/207 |
| 2023/0169903 A1* | 6/2023 | Kim | G09G 3/3406 345/207 |
| 2023/0221760 A1* | 7/2023 | Choi | H04M 1/725 |
| 2024/0323273 A1* | 9/2024 | Ma | G06F 3/14 |

FOREIGN PATENT DOCUMENTS

| | | |
|---|---|---|
| KR | 20150062699 A | 6/2015 |
| KR | 20150131944 A | 11/2015 |
| KR | 20160029698 A | 3/2016 |
| KR | 20170141522 A | 12/2017 |
| KR | 20180117003 A | 10/2018 |
| KR | 20190041648 A | 4/2019 |
| KR | 20190088159 A | 7/2019 |
| KR | 20190112624 A | 10/2019 |
| KR | 20200050453 A | 5/2020 |
| WO | 2015140600 A1 | 9/2015 |

\* cited by examiner

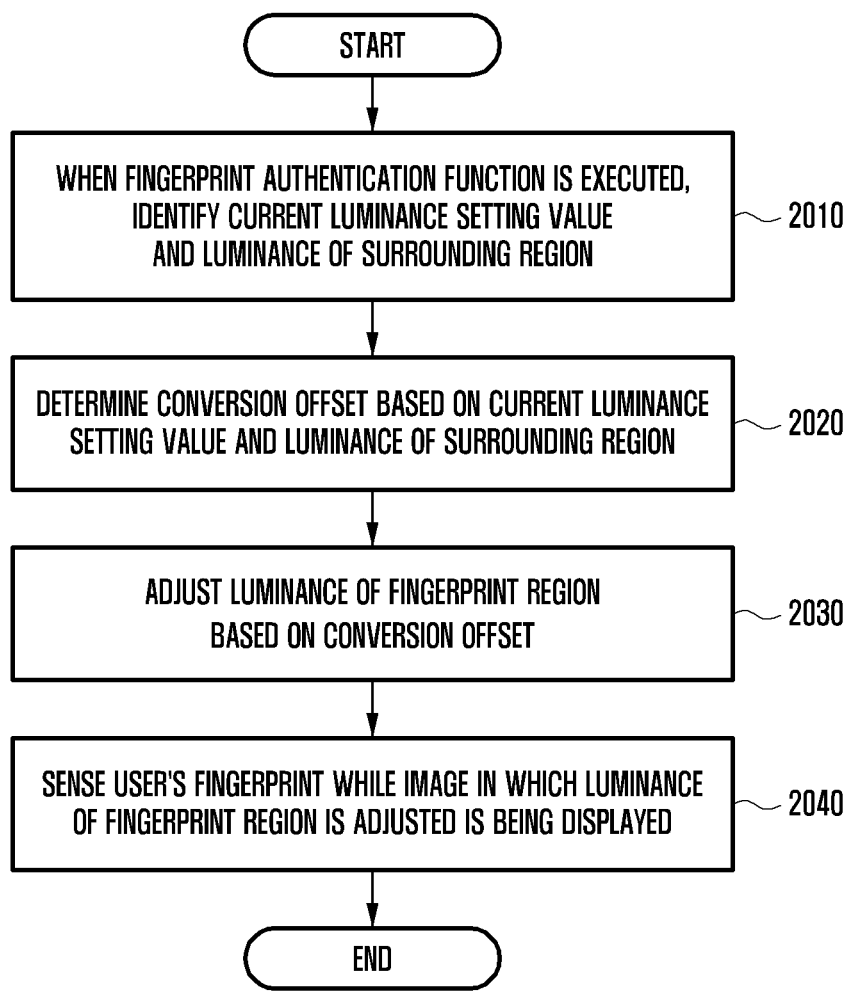

ELECTRONIC APPARATUS AND METHOD WHICH MAY IMPROVE PERFORMANCE OF SENSOR MODULE

CROSS-REFERENCE TO RELATED APPLICATIONS

This application is a continuation of International Application No. PCT/KR2022/002871 filed on Feb. 28, 2022, designating the United States, in the Korean Intellectual Property Receiving Office, and claiming priority to KR Patent Application No. 10-2021-0029520 filed on Mar. 5, 2021 and KR Patent Application No. 10-2021-0194388 filed on Dec. 31, 2021, in the Korean Intellectual Property Office, the disclosures of all of which are hereby incorporated by reference herein in their entireties.

BACKGROUND

Field

Various example embodiments relate to an electronic device and/or method capable of improving the performance of a sensor module.

Description of Related Art

Electronic devices such as portable electronic devices are supplied in various sizes according to their functions and user preferences, and may include a large-screen touch display for securing wide visibility and convenience of manipulation.

SUMMARY

A portable electronic device may increase the display area of a display by arranging plural sensor modules to overlap at least a portion of the display. For example, the plural sensor modules may be optical sensors disposed below at least a portion of the display and receiving light transmitted through at least a portion of the display. The plural sensor modules may include a fingerprint sensor and/or an illuminance sensor. The performance of the plural sensor modules may be affected by the luminance or on-off duty ratio (e.g., active matrix organic light-emitting diode (AMOLED) off ratio (AOR)) of an image displayed through the display.

Various example embodiments may provide an electronic device and method that improve performance of plural sensor modules by adjusting the luminance or on-off duty ratio (e.g., AMOLED off ratio (AOR)) of the image during operation of the plural sensor modules overlapping at least a portion of the display.

An example technical purpose which may be achieved in certain example embodiments are not limited to those mentioned above, and other technical objectives/purposes not mentioned may be understood by those skilled in the art to which the disclosure belongs from the following description.

An electronic device according to various example embodiments may include: a display panel; a fingerprint sensor disposed to overlap at least a portion of the display panel; and a processor operably connected, directly or indirectly, to the display panel and the fingerprint sensor, wherein the processor may be configured to: execute a fingerprint authentication function using the fingerprint sensor; identify an AMOLED off ratio (AOR) and luminance setting value of the display panel in response to execution of the fingerprint authentication function; adjust the AOR linearly or set the AOR to a specified value (e.g., a specified minimum value) according to a section to which the luminance setting value belongs; and perform fingerprint authentication by using the fingerprint sensor while the AOR is maintained at the specified value (e.g., minimum value).

A method for an electronic device including a fingerprint sensor disposed to overlap at least a portion of a display panel according to various example embodiments may include: executing a fingerprint authentication function using the fingerprint sensor; identifying an AMOLED off ratio (AOR) and luminance setting value of the display panel in response to execution of the fingerprint authentication function; adjusting the AOR linearly or setting the AOR to a specified minimum value according to a section to which the luminance setting value belongs; and performing fingerprint authentication by using the fingerprint sensor while the AOR is maintained at the minimum value.

The electronic device and/or method according to various example embodiments may improve the performance of the fingerprint sensor and prevent or reduce flickering of the display from being recognized during fingerprint authentication at least by adjusting the on-off duty ratio (e.g., AMOLED off ratio (AOR)) of the display to a minimum or low setting value for example in a linearized manner.

The electronic device and/or method according to various example embodiments may compensate for data of the fingerprint region overlapping the fingerprint sensor while performing fingerprint authentication, which can reduce a lifespan deviation and/or burn-in deviation between the fingerprint region and a region other than the fingerprint region and prevent or reduce a chance of the boundary of the fingerprint region from being visually recognized due to the lifespan deviation.

Further, it is possible to provide various effects identified directly or indirectly.

BRIEF DESCRIPTION OF DRAWINGS

Other aspects, features and advantages according to specific example embodiments will become more apparent from the accompanying drawings and corresponding descriptions in association.

FIG. 20 is a flowchart for an example electronic device to compensate for burn-in of the fingerprint region.

DETAILED DESCRIPTION

Figure 1:
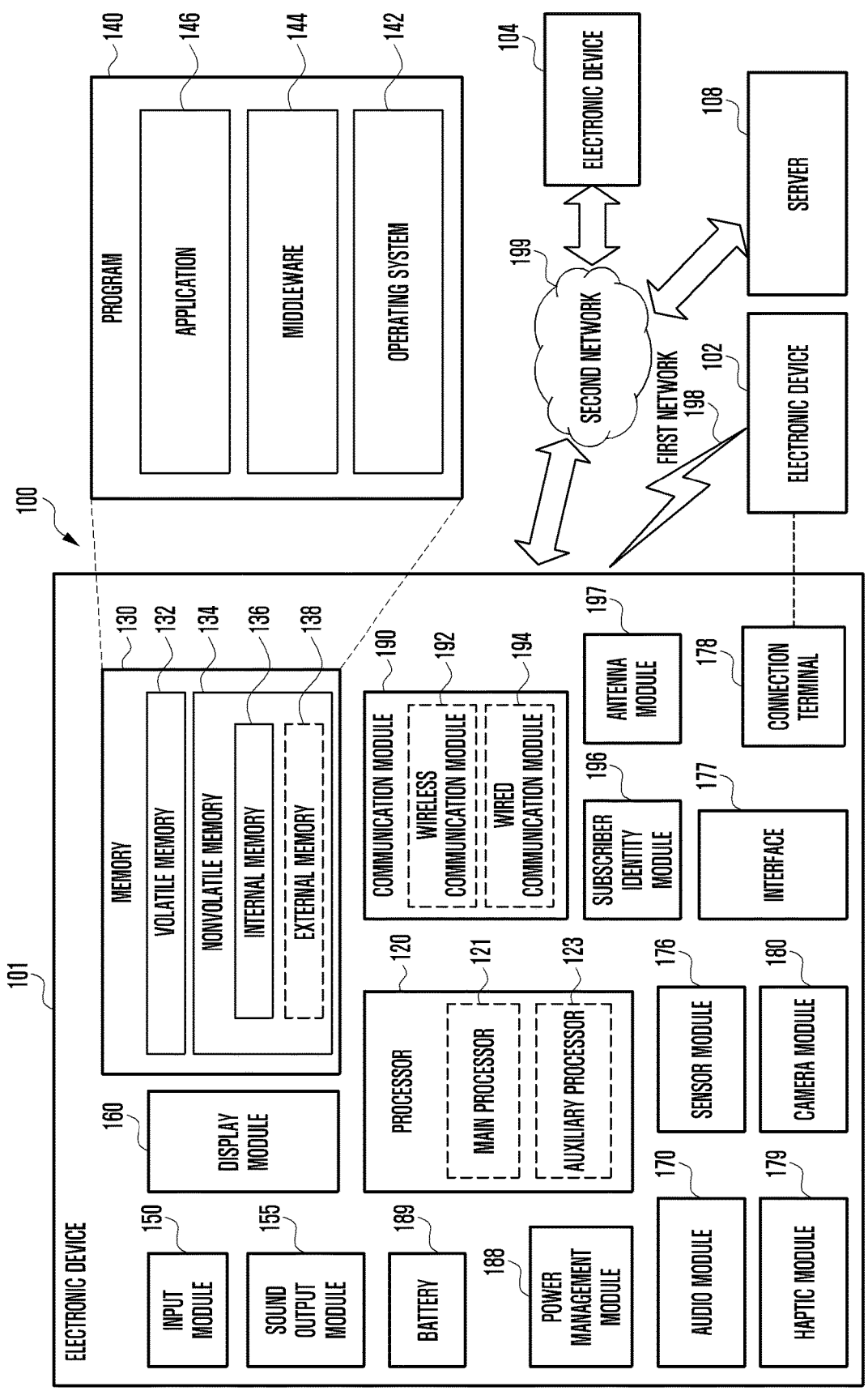
FIG. 1 is a block diagram of an electronic device in a network environment according to various example embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "$1^{st}$" and "$2^{nd}$," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via at least a third element(s).

As used in connection with various example embodiments, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various example embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
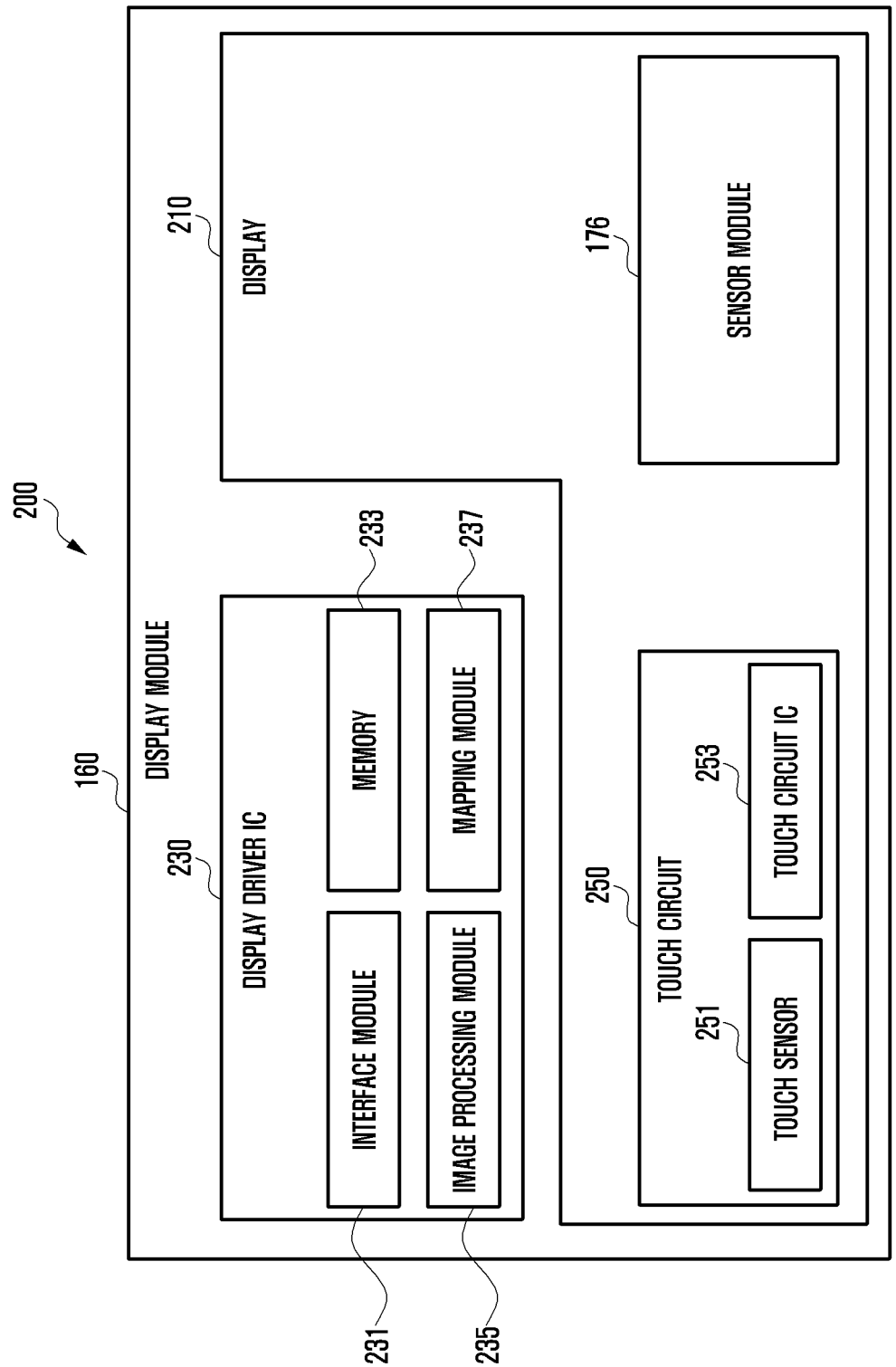
FIG. 2 is a block diagram of a display module according to various example embodiments.

FIG. 2 is a block diagram 200 of a display module 160 according to various embodiments. With reference to FIG. 2, the display module 160 may include a display 210 and a display driver IC (DDI) 230 for controlling the display 210. The DDI 230 may include an interface module 231 comprising interface circuitry, a memory 233 (e.g., buffer memory), an image processing module 235 comprising processing circuitry, and/or a mapping module 237 comprising circuitry. The DDI 230 may receive, for example, video information including video data or a video control signal corresponding to a command for controlling the video data through the interface module 231 from other components of the electronic device 101. For example, according to an embodiment, video information may be received from the processor 120 (e.g., main processor 121, application processor) or the auxiliary processor 123 that operates independently of the function of the main processor 121 (e.g., graphics processing unit). The DDI 230 may communicate with a touch circuit 250 or a sensor module 176 through the interface module 231. Also, the DDI 230 may store at least some of the received video information in the memory 233, for example, in units of frames. The image processing module 235 may perform, for example, pre-processing or post-processing (e.g., resolution, brightness, or size adjustment) on at least a portion of video data based at least on characteristics of the video data or characteristics of the display 210. The mapping module 237 may generate a voltage value or a current value corresponding to the video data pre-processed or post-processed through the image processing module 235 which may comprise processing circuitry. According to an embodiment, generation of voltage values or current values may be performed based at least in part on attributes of pixels (e.g., arrangement of pixels (RGB stripe or pentile structure), or size of each sub-pixel) of the display 210, for example. At least some pixels of the display 210 are driven based at least partially on the above voltage value or current value, so that visual information (e.g., text, image, or icon) corresponding to the video data can be displayed on the display 210.

According to an embodiment, the display module 160 may further include a touch circuit 250. The touch circuit 250 may include a touch sensor 251 and a touch sensor IC 253 for controlling the touch sensor 251. The touch sensor IC 253 may control the touch sensor 251 to detect, for example, a touch input or a hovering input as to a specific position of the display 210. For example, the touch sensor IC 253 (e.g., of or including a touch sensor IC) may detect a touch input or a hovering input by measuring a change of a signal (e.g., voltage, light amount, resistance, or charge amount) for a specific position of the display 210. The touch sensor IC 253 may provide information (e.g., location, area, pressure, or time) about the detected touch input or hovering input to the processor 120. According to an embodiment, at least a portion of the touch circuit 250 (e.g., touch sensor IC 253) may be included as a part of the display driver IC 230, the display 210, or other component (e.g., auxiliary processor 123) disposed outside the display module 160.

According to an embodiment, the display module 160 may further include at least one sensor (e.g., fingerprint sensor, iris sensor, pressure sensor, or illumination sensor) of the sensor module 176 or a control circuit for the at least one sensor. In this case, the at least one sensor or control circuit thereof may be embedded in a part of the display module 160 (e.g., display 210 or DDI 230) or a part of the touch circuit 250. For example, when the sensor module 176 embedded in the display module 160 includes a biometric sensor (e.g., fingerprint sensor), this biometric sensor may obtain biometric information (e.g., fingerprint image) associated with a touch input through a region of the display 210. As another example, when the sensor module 176 embedded in the display module 160 includes or is of a pressure sensor, this pressure sensor may obtain pressure information associated with a touch input through some or the whole of the display 210. According to an embodiment, the touch sensor 251 or the sensor module 176 may be disposed between pixels of a pixel layer of the display 210, or above or below the pixel layer. Each "sensor module" herein may comprise at least one sensor.

Figure 3:
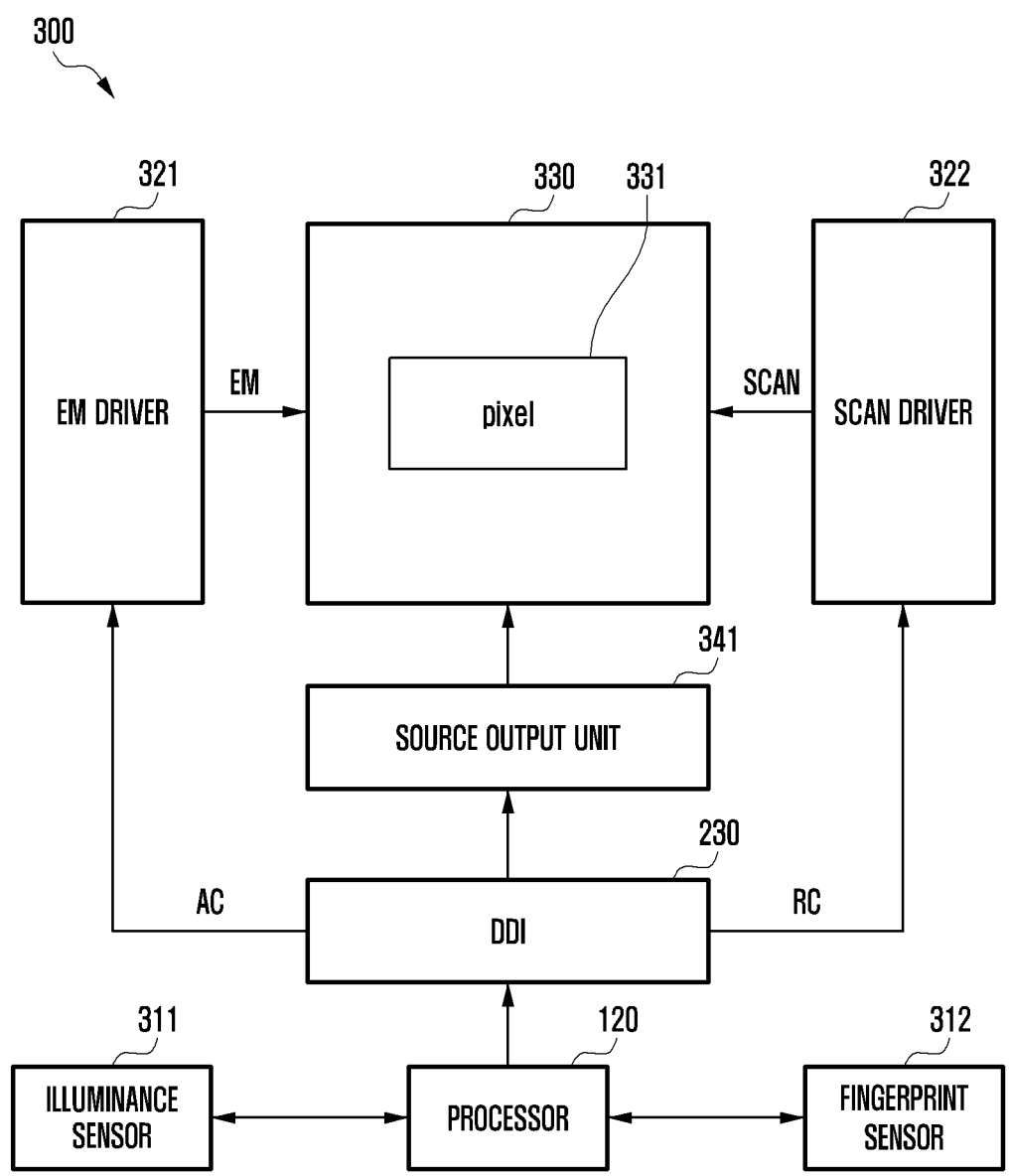
FIG. 3 is a block diagram of an electronic device according to an example embodiment.

FIG. 3 is a block diagram of an electronic device 300 according to an embodiment.

With reference to FIG. 3, the electronic device 300 (e.g., electronic device 101 in FIG. 1) according to an embodiment may include a processor 120, a DDI 230, a source output unit 341, a display panel 330, an emission (EM) driver (or, light emission driver) 321, a scan driver 322, an illuminance sensor 311, or a fingerprint sensor 312.

According to an embodiment, the electronic device 300 may operate based on a command mode, which is defined in the mobile industry processor interface (MIPI) being a standard for the display 210. For example, the processor 120 of the electronic device 300 may serve as a host defined in MIPI. The DDI 230 may output a tearing effect (TE) signal at a specific frequency, and the processor 120 may transfer video data to the DDI 230 based on the TE signal. The DDI 230 may convert the video data received from the processor 120 according to the characteristics (e.g., resolution) of the display 210, and transfer the converted video data to the display panel 330 through the source output unit 341.

According to an embodiment, the DDI 230 may control the EM driver 321 and the scan driver 322 based on the timing at which the source output unit 341 supplies video data to the display panel 330. According to an embodiment, the scan driver 322 may supply video data output from the source output unit 341 to individual pixels 331 by supplying a scan signal SCAN in sequence to the display panel 330. According to an embodiment, the EM driver 321 may supply an emission signal EM in sequence to the display panel 330 to thereby drive the pixels 331 of the display panel 330 so that each pixel 331 emits light of a specified gray scale corresponding to video data.

According to an embodiment, under the control of the processor 120, the DDI 230 may supply a first control signal AC for adjusting the on-off duty ratio (hereinafter referred to as AOR (AMOLED off ratio)) of the display panel 330 to the EM driver 321. The EM driver 321 may adjust the AOR of the display panel 330 by adjusting the output timing of the emission signal EM based on the first control signal AC.

According to an embodiment, under the control of the processor 120, the DDI 230 may supply a second control signal RC for adjusting the refresh rate of the display panel 330 to the scan driver 322. The scan driver 322 may adjust the refresh rate (e.g., frequency of scan signal SCAN) of the display panel 330 based on the second control signal RC.

According to an embodiment, the illuminance sensor 311 may be disposed to overlap at least a portion of the display area of the display panel 330. For example, the illuminance sensor 311 may be disposed under a first region of the display panel 330 and may detect external illuminance by receiving light passing through the first region. According to an embodiment, the performance of the illuminance sensor 311 may be affected by the AOR of the display panel 330. For example, the performance of the illuminance sensor 311 may be improved as it is less affected by light output from the display 210. Hence, the performance of the illuminance sensor 311 may be improved as the ratio at which the display 210 is turned off within one frame, that is, the AOR increases.

According to an embodiment, the fingerprint sensor 312 may be disposed to overlap at least a portion of the display area of the display panel 330. For example, the fingerprint sensor 312 may be disposed under a second region of the display panel 330 and may obtain information related to the user's fingerprint by receiving light passing through the second region. According to an embodiment, the performance of the fingerprint sensor 312 may be affected by the AOR of the display panel 330. For example, the performance of the fingerprint sensor 312 may be improved as the duration of light output from the display 210 is longer. Hence, the performance of the fingerprint sensor 312 may be improved as the ratio at which the display 210 is turned off within one frame, that is, the AOR decreases.

According to an embodiment, to improve the performance of the illuminance sensor 311 and the fingerprint sensor 312, the processor 120 or the DDI 230 may adjust the AOR of the display panel 330 based on the duration when the illuminance sensor 311 and/or the fingerprint sensor 312 operate.

Figure 4:
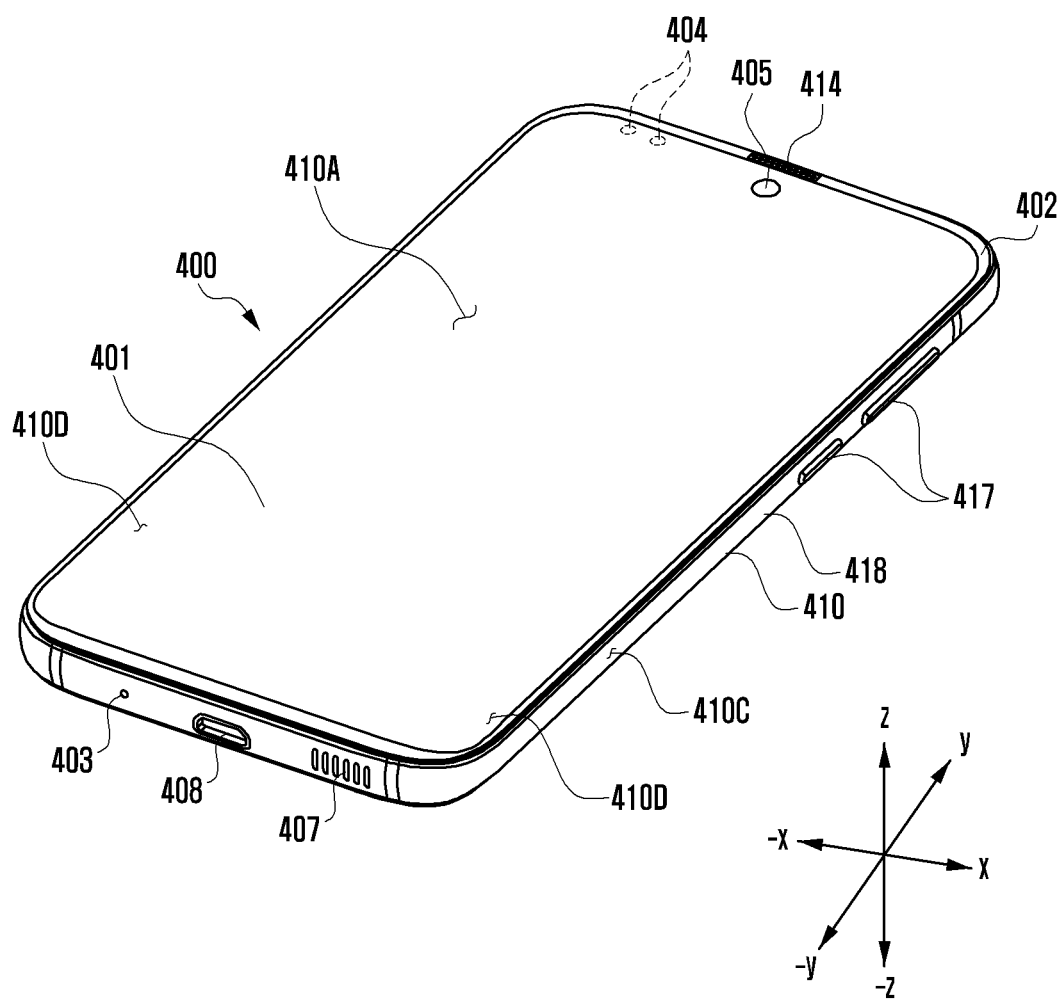
FIG. 4 is a front perspective view of an electronic device (e.g., mobile electronic device) according to various example embodiments.
Figure 5:
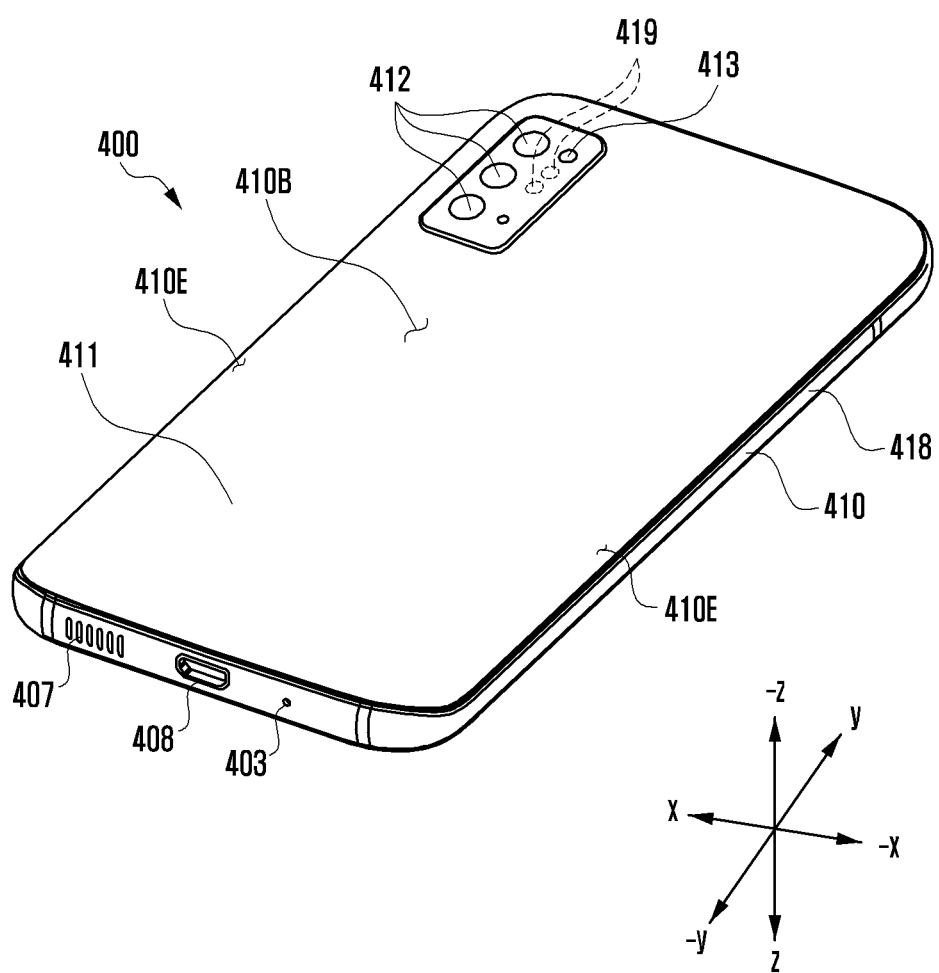
FIG. 5 is a rear perspective view of an electronic device according to various example embodiments.

FIG. 4 is a front perspective view of an electronic device 400/500 (e.g., mobile electronic device 400/500) according to various embodiments. FIG. 5 is a rear perspective view of the electronic device 400/500 according to various example embodiments.

With reference to FIG. 4 and FIG. 5, in an embodiment, the electronic device 400 may include a housing 410 that includes a first surface (or, front surface) 410A, a second surface (or, rear surface) 410B, and a side surface 410C surrounding the space between the first surface 410A and the second surface 410B. In another embodiment, the housing may refer to a structure forming at least some of the first surface 410A, the second surface 410B, and the side surface 410C. According to an embodiment, the first surface 410A may be formed by a front plate 402 that is substantially transparent at least in part (e.g., glass plate containing various coating layers, or polymer plate). The second surface 410B may be formed by a rear plate 411 that is substantially opaque. The rear plate 411 may be made of, for example, coated or colored glass, ceramic, polymer, metal (e.g., aluminum, stainless steel (STS), or magnesium), or a combination thereof. The side surface 410C may be formed by a lateral bezel structure (or, "lateral member") 418 that is coupled, directly or indirectly, to the front plate 402 and the rear plate 411 and contains a metal and/or a polymer. In a certain embodiment, the rear plate 411 and the lateral bezel structure 418 may be integrally formed and contain the same material (e.g., metal material such as aluminum).

In the illustrated embodiment, the front plate 402 may include first regions 410D, which are curved and seamlessly extended from the first surface 410A toward the rear plate, at both ends of the long edge of the front plate. According to an embodiment, the rear plate 411 may include second regions 410E, which are curved and seamlessly extended from the second surface 410B toward the front plate, at both ends of the long edge. In a certain embodiment, the front plate 402 or the rear plate 411 may include only one of the first region 410D or the second region 410E. In a certain embodiment, the front plate 402 may include only a flat surface disposed parallel to the second surface 410B without including the first region or the second region. In the above embodiments, when viewed from the side of the electronic device 400, the lateral bezel structure 418 may have a first thickness (or width) on a side where the first region 410D or the second region 210E is not present, and may have a second thickness thinner than the first thickness on a side where the first region 410D or the second region 410E is present.

According to an embodiment, the electronic device 400 may include at least one of a display 401, an input device 403, sound output devices 407 and 414, sensor modules 404 and 419 each comprising at least one sensor, camera modules 405 and 412 each comprising at least one camera, key input devices 417, an indicator (not shown), or a connector 408. In a certain embodiment, the electronic device 400 may be configured to omit at least one (e.g., key input device 417, indicator) of the above components or further include other components.

The display 401 may be exposed through a substantial portion of the front plate 402, for example. In a certain embodiment, at least a portion of the display 401 may be exposed through the front plate 402 forming the first surface 410A and the first region 410D of the side surface 410C. The display 401 may be disposed in combination with or adjacent to a touch sensing circuit, a pressure sensor capable of measuring the intensity (pressure) of a touch, and/or a digitizer that detects a stylus pen of a magnetic field type. In a certain embodiment, at least some of the sensor modules 404 and 419 and/or at least some of the key input devices 417 may be disposed in the first region 410D and/or the second region 410E.

The input device 403 may include a microphone 403. In a certain embodiment, the input device 403 may include a plurality of microphones 403 arranged to detect the direction of a sound. The sound output devices 407 and 414 may include speakers 407 and 414. The speakers 407 and 414 may include an external speaker 407 and a call receiver 414. In a certain embodiment, the microphone 403, the speakers 407 and 414, and the connector 408 may be disposed at least partially in the internal space of the electronic device 400 and may be exposed to the external environment through at least one hole formed in the housing 410. In a certain embodiment, the hole formed in the housing 410 may be used in common for the microphone 403 and the speakers 407 and 414. In a certain embodiment, the sound output devices 407 and 414 may include a speaker (e.g., piezo speaker) operating without using a hole formed in the housing 410.

The sensor module 404 or 419 may generate an electrical signal or data value corresponding to an internal operating state of the electronic device 400 or an external environmental state. The sensor modules 404 and 419 may include, for example, at least one of gesture sensor, grip sensor, color sensor, infrared (IR) sensor, illuminance sensor (e.g., illuminance sensor 311 in FIG. 3), ultrasonic sensor, iris recognition sensor, heart rate monitoring (HBM) sensor, or distance detection sensor (TOF sensor or RiDAR scanner). The electronic device 400 may further include a fingerprint sensor 312 (e.g., fingerprint sensor 312 in FIG. 3) (not shown). The fingerprint sensor 312 may be disposed on the first surface 410A of the housing 410 (e.g., home key button), on a portion of the second surface 410B, and/or below the display 401. The electronic device 400 may further include at least one sensor module (not shown), such as gesture sensor, gyro sensor, barometric pressure sensor, magnetic sensor, acceleration sensor (e.g., motion sensor), grip sensor, color sensor, infrared (IR) sensor, biometric sensor, temperature sensor, humidity sensor, proximity sensor, or illuminance sensor 311.

The camera modules 405 and 412 may include a first camera module 405 disposed on the first surface 410A of the electronic device 400, a second camera module 412 disposed on the second surface 410B, and/or a flash 413. The camera modules 405 and 412 may include one or plural lenses, an image sensor, and/or an image signal processor 120. The flash 413 may include, for example, a light emitting diode or a xenon lamp. In a certain embodiment, two or more lenses (wide-angle lens, ultra-wide-angle lens, or telephoto lens) and image sensors may be disposed on one surface of the electronic device 400.

The key input devices 417 may be disposed on the side surface 410C of the housing 410. In another embodiment, the electronic device 400 may not include some or all of the above-mentioned key input devices 417, and those key input devices 417 not included may be implemented in other forms such as soft keys on the display 401. As another embodiment, the key input devices 417 may be implemented by using a pressure sensor included in the display 401.

The indicator may be disposed on, for example, the first surface 410A of the housing 410. The indicator may provide, for example, state information of the electronic device 400 in the form of light (e.g., light emitting element). In another embodiment, the light emitting element may provide a light source linked with, for example, the operation of the camera module 405. The indicator may include, for example, an LED, an IR LED, and/or a xenon lamp.

The connector hole 408 may include a first connector hole 408 capable of accommodating a connector (e.g., universal serial bus (USB) connector) for transmitting and receiving power and/or data to and from an external electronic device, and/or a second connector hole (or, earphone jack) (not shown) capable of accommodating a connector for transmitting and receiving an audio signal to and from an external electronic device.

The camera module 405 of the camera modules 405 and 412, the sensor module 404 of the sensor modules 404 and 419, or the indicator may be disposed to be exposed through the display 401. For example, the camera module 405, the sensor module 404, or the indicator may be disposed to be in contact with the external environment through a through hole perforated from the internal space of the electronic device 400 to the front plate 402 of the display 401. In another embodiment, some sensor modules 404 may be arranged to perform their functions in the internal space of the electronic device 400 without being visually exposed through the front plate 402. For example, a through hole may be not required in a region of the display 401 facing some sensor modules 404.

Figure 6:
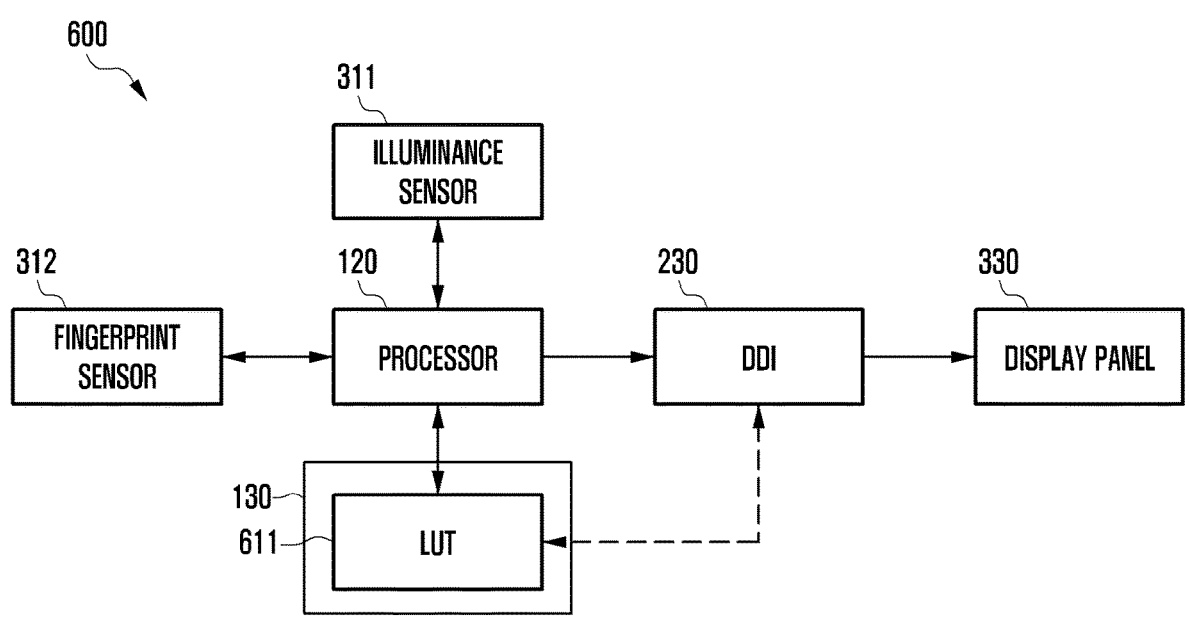
FIG. 6 is a block diagram of an electronic device including a fingerprint sensor and an illuminance sensor according to an example embodiment.

FIG. 6 is a block diagram of an electronic device 600 including a fingerprint sensor 312 and an illuminance sensor 311 according to an embodiment.

With reference to FIG. 6, the electronic device 600 (e.g., electronic device 101 in FIG. 1) according to an embodiment may include a processor 120, a fingerprint sensor (e.g., fingerprint sensor 312 in FIG. 3), an illuminance sensor (e.g., illuminance sensor 311 in FIG. 3), a DDI (e.g., DDI 230 in FIG. 2), a display (e.g., display 330/210 in FIGS. 2-3), or a memory (e.g., memory 130 in FIG. 1) storing a look-up table (LUT) 611. According to an embodiment, the memory 130 may be included in the processor 120, in the DDI 230, or in the display panel (e.g., display panel 330 in FIG. 3).

According to an embodiment, to improve the performance of the illuminance sensor 311 and the performance of the fingerprint sensor 312, the processor 120 or the DDI 230 may adjust the AOR of the display panel 330 based on the duration when each of the illuminance sensor 311 and the fingerprint sensor 312 operates.

Figure 8:
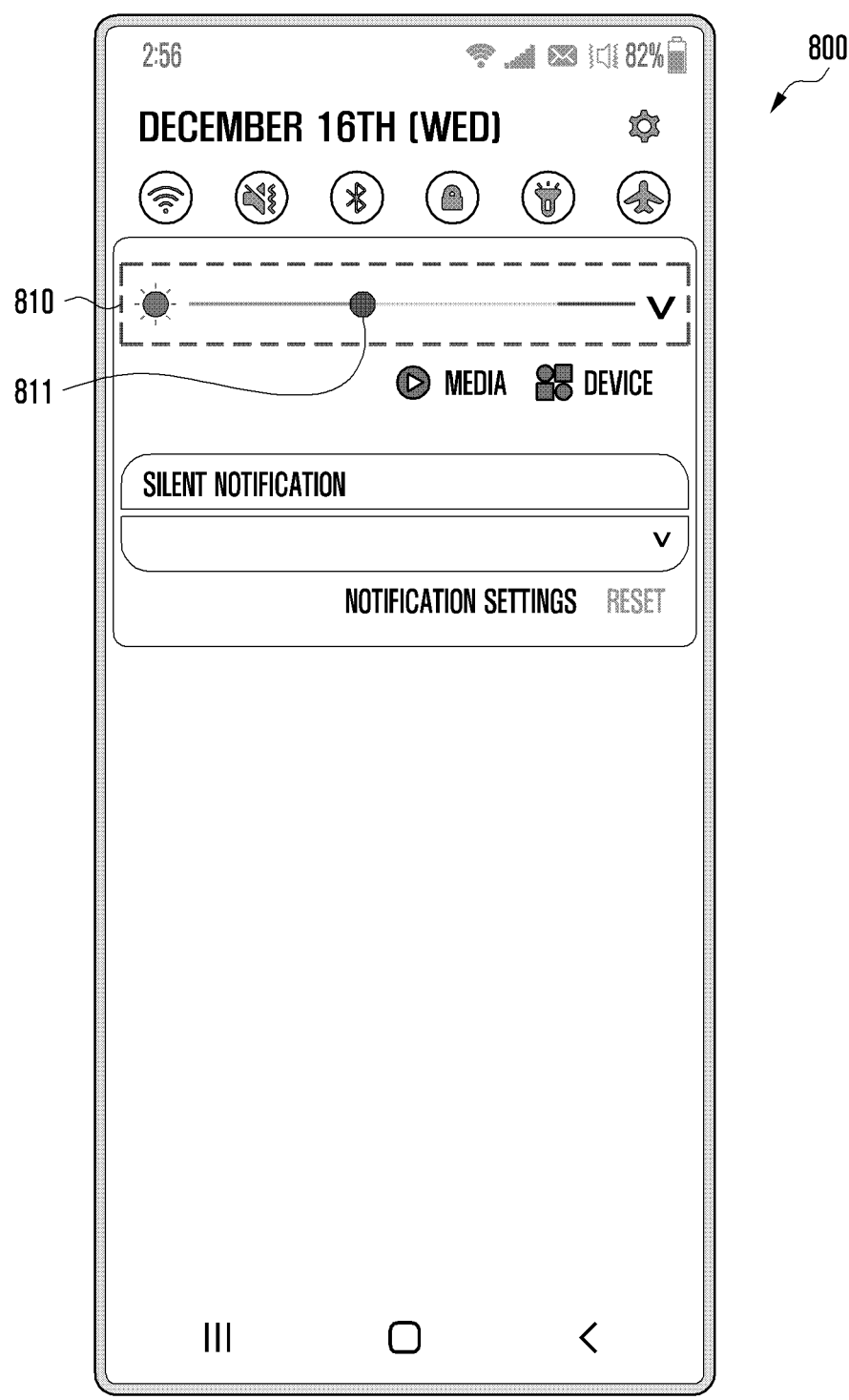
FIG. 8 illustrates an example embodiment of a user interface for setting a luminance setting value.

According to an embodiment, to adjust the AOR of the display panel 330, the processor 120 may adjust a first control signal (e.g., first control signal in FIG. 3) supplied to the EM driver 321 (e.g., EM driver 321 in FIG. 3). According to an embodiment, the processor 120 may refer to the LUT 611 storing luminance setting values of the display panel 330 and AOR values mapped to the luminance setting values of the display panel 330, and the LUT 611 may be stored in the memory (e.g., memory 130 in FIG. 1). According to an embodiment, the luminance setting value of the display panel 330 may be set based on a user input through a user interface 800 as shown in FIG. 8, and may be automatically adjusted based on an illuminance sensing value obtained through the illuminance sensor 311.

In another embodiment, the DDI 230 may include the LUT 611. In this case, the DDI 230 may receive information (or data) on whether the fingerprint sensor 312 is operating from the processor 120, refer to the LUT 611 in response to receiving the above information, and may adjust the AOR based on the LUT 611.

According to an embodiment, considering that the performance of the illuminance sensor 311 is affected by the AOR, the processor 120 may control the display panel 330 with a relatively high AOR value while the fingerprint sensor 312 is not operating. For example, to improve the performance of the illuminance sensor 311, when the fingerprint sensor 312 is not operating and the luminance value of the display panel 330 is in a range of about 100 nit to about 420 nit, the processor 120 may adjust the AOR value to a specified maximum or large value. The electronic device 600 may more accurately perform automatic brightness adjustment of the display panel 330 based on the illuminance sensing value by improving the signal to noise ratio (SNR) of illuminance sensing values obtained through the illuminance sensor 311. Here, automatic brightness adjustment of the display panel 330 based on the illuminance sensing value may include an operation of the electronic device 600 to increase the luminance value of the display panel 330 in proportion to an illuminance sensing value. According to an embodiment, the processor 120 may identify whether illuminance sensing values obtained from the illuminance sensor 311 have a deviation greater than or equal to a specific range. According to an embodiment, if the illuminance sensing values obtained from the illuminance sensor 311 have a deviation greater than or equal to the specific range, the processor 120 may adjust the AOR to a specified maximum or large value to thereby improve the performance of the illuminance sensor 311. As such, the electronic device 600 may reduce errors of inaccurately detecting external illuminance of the electronic device 600 due to performance degradation of the illumination sensor 311 during an automatic brightness adjustment operation.

According to an embodiment, the processor 120 may sense external illuminance through the illuminance sensor 311 while the AOR value is being adjusted to the maximum or large value. According to an embodiment, the processor 120 may perform automatic brightness adjustment of the display panel 330 based on the sensed external illuminance. The electronic device 600 according to an embodiment may increase the sensing accuracy of the illuminance sensor 311 and thus provide more accurate automatic brightness adjustment of the display panel 330.

According to an embodiment, when the fingerprint authentication function is executed, the processor 120 may call a fingerprint application programming interface (API) related to the operation of the fingerprint sensor 312. For example, the processor 120 may detect that the fingerprint authentication function is executed when a touch input is detected in a region of the display panel 330 where the fingerprint sensor 312 is located or a specified application is run. According to an embodiment, the processor 120 may identify the current AOR value and current luminance setting value when the fingerprint API is called. According to an embodiment, the processor 120 may linearly adjust the AOR according to the section to which the luminance setting value belongs, or adjust the AOR to a specified minimum value.

According to an embodiment, adjustment of the AOR value by the electronic device 600 may be performed by the processor 120 referring to the LUT 611 stored in the memory 130 or by the DDI 230 referring to the LUT 611 included in the DDI 230. These operation scenarios of the electronic device 600 can be classified as shown in Table 1.

TABLE 1

|  | Main agent of operation | Previous state of electronic device 600 |
|---|---|---|
| Case 1 | processor 120 | locked state (e.g., idle state) |

TABLE 1-continued

|  | Main agent of operation | Previous state of electronic device 600 |
|---|---|---|
| Case 2 | processor 120 | state of displaying screen of specific application |
| Case 3 | DDI 230 | locked state (e.g., idle state) |
| Case 4 | DDI 230 | state of displaying screen of specific application |

Referring to case 1 of Table 1, the electronic device 600 may be in a locked state where the display panel 330 is deactivated (e.g., idle state). For example, the display panel 330 of the electronic device 600 may be in a state of displaying only a specific object (e.g., clock or calendar) according to a specified lock screen or AOD (always on display) function. The processor 120 may detect, in the locked state, a touch input to the fingerprint region (e.g., fingerprint region 1510 in FIG. 15) being at least a portion of the display panel 330 overlapping the fingerprint sensor 312. For example, the processor 120 may detect a touch input to the fingerprint region 1510 through a touch IC and call a fingerprint API in response to the touch input. According to an embodiment, the processor 120 may execute a fingerprint authentication function after calling the fingerprint API. According to an embodiment, when the fingerprint authentication function is executed, the processor 120 may identify the current AOR and current luminance setting value, and may linearly adjust the AOR according to a section to which the luminance setting value belongs or adjust the AOR to a specified value (e.g., a specified minimum value). According to an embodiment, the processor 120 may obtain information corresponding to the user's fingerprint through the fingerprint sensor 312 in a state where the AOR is adjusted, and may perform fingerprint authentication by comparing the obtained information with stored authentication information. Referring to case 2 of Table 1, the electronic device 600 may be in a state of displaying a screen of a specific application. According to an embodiment, the electronic device 600 may receive a request for executing a fingerprint authentication function from the user in a state of displaying the screen of a specific application. For example, the processor 120 may display an execution screen of an application requiring security authentication such as a banking application, and call a fingerprint API in response to a user input through the execution screen. According to an embodiment, the processor 120 may execute the fingerprint authentication function after calling the fingerprint API. According to an embodiment, when the fingerprint authentication function is executed, the processor 120 may identify the current AOR and current luminance setting value, and may linearly adjust the AOR according to a section to which the luminance setting value belongs or adjust the AOR to a specified minimum value. According to an embodiment, the processor 120 may obtain information corresponding to the user's fingerprint through the fingerprint sensor 312 in a state where the AOR is adjusted, and may perform fingerprint authentication by comparing the obtained information with stored authentication information. Referring to case 3 of Table 1, the processor 120 may detect a touch input to the fingerprint region 1510 being at least a portion of the display panel 330 overlapping the fingerprint sensor 312 in a locked state. For example, the processor 120 may detect a touch input to the fingerprint region 1510 through the touch IC and call a fingerprint API in response to the touch input. According to an embodiment, the processor 120 may execute a fingerprint authentication function after calling the fingerprint API. According to an embodiment, when the fingerprint authentication function is executed, the processor 120 may transmit information (or data) about the operation of the fingerprint sensor 312 to the DDI 230. According to an embodiment, based on the information received from the processor 120, the DDI 230 may identify the current AOR and the current luminance setting value, and may linearly adjust the AOR according to a section to which the luminance setting value belongs or adjust the AOR to a specified minimum value. According to an embodiment, the processor 120 may obtain information corresponding to the user's fingerprint through the fingerprint sensor 312 in a state where the AOR is adjusted, and may perform fingerprint authentication by comparing the obtained information with stored authentication information.

Referring to case 4 of Table 1, the electronic device 600 may receive a request for executing a fingerprint authentication function from the user in a state of displaying the screen of a specific application. For example, the processor 120 may display an execution screen of an application requiring security authentication such as a banking application, and call a fingerprint API in response to a user input through the execution screen. According to an embodiment, the processor 120 may execute the fingerprint authentication function after calling the fingerprint API. According to an embodiment, when the fingerprint authentication function is executed, the processor 120 may transmit information (or data) about the operation of the fingerprint sensor 312 to the DDI 230. According to an embodiment, based on the information received from the processor 120, the DDI 230 may identify the current AOR and the current luminance setting value, and may linearly adjust the AOR according to a section to which the luminance setting value belongs or adjust the AOR to a specified minimum value. According to an embodiment, the processor 120 may obtain information corresponding to the user's fingerprint through the fingerprint sensor 312 in a state where the AOR is adjusted, and may perform fingerprint authentication by comparing the obtained information with stored authentication information.

Figure 7A:
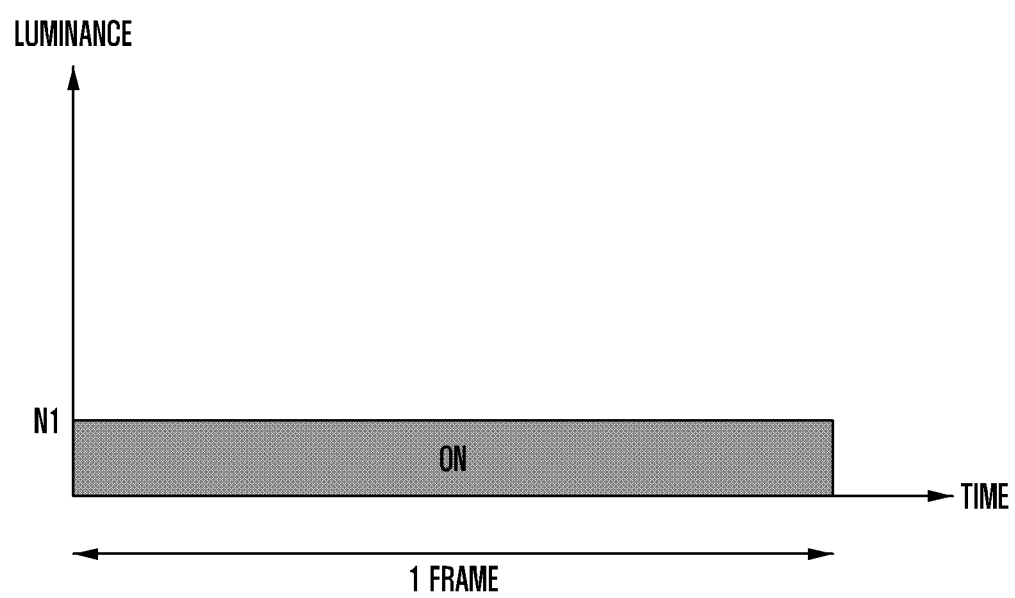
FIG. 7A illustrates an example case where the on-off duty ratio (e.g., AMOLED off ratio (AOR)) of a display panel is 0 percent.

FIG. 7A illustrates a case where the on-off duty ratio (e.g., AMOLED off ratio (AOR)) of the display panel 330 is 0 percent.

Figure 7B:
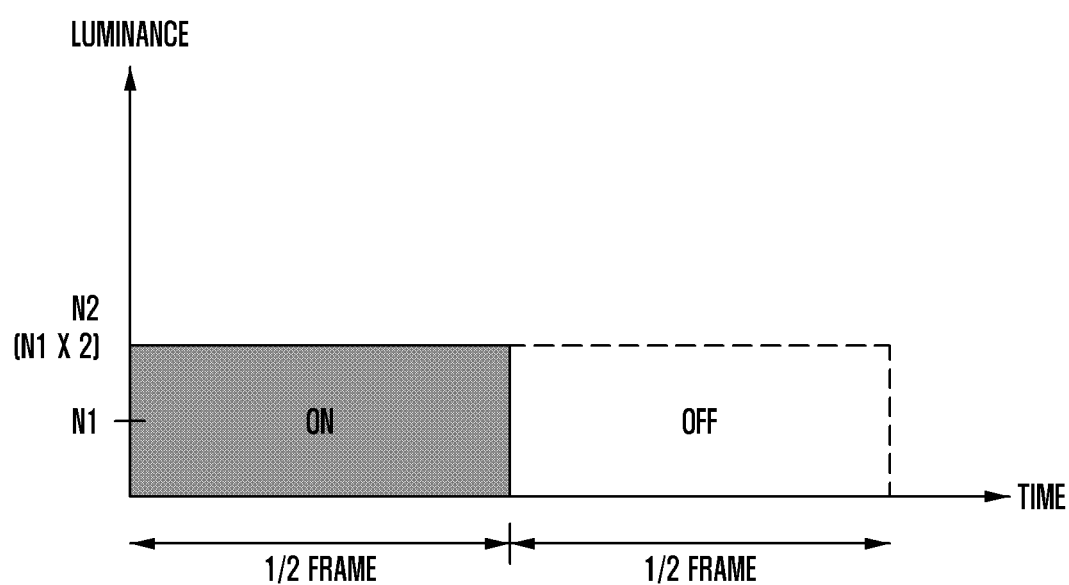
FIG. 7B illustrates an example case where the on-off duty ratio (e.g., AMOLED off ratio (AOR)) of a display panel is 50 percent.

FIG. 7B illustrates a case where the on-off duty ratio (e.g., AMOLED off ratio (AOR)) of the display panel is 50 percent.

In FIGS. 7A and 7B, the horizontal axis may represent time, and the vertical axis may represent the luminance of the display panel.

With reference to FIGS. 7A and 7B, the AOR may indicate a ratio of a time during which the display panel (e.g., display panel 330 in FIG. 3) does not output an image during the period of one frame. For example, as shown in FIG. 7A, when the display panel 330 remains in an on state of outputting an image for the entire period of one frame, the AOR may be 0 percent. For example, as shown in FIG. 7B, when the display panel 330 remains in an on state of outputting an image for a ½ frame period and remains in an off state of not outputting an image for the remaining ½ frame period, the AOR may be 50 percent.

According to an embodiment, the electronic device 101 can maintain the same luminance perceived by the user even if the AOR is adjusted by adjusting the output luminance of the display panel 330. For example, assuming that the output luminance of the display panel 330 is N1 in FIG. 7A, when the output luminance of the display panel 330 is set to N2 being twice N1 as shown in FIG. 7B, even if the AOR is adjusted from 0 percent as in FIG. 7A to 50 percent as in FIG. 7B, the luminance perceived by the user may remain the same.

FIG. 8 illustrates an embodiment of a user interface for setting a luminance setting value.

With reference to FIG. 8, the luminance setting value of the display panel (e.g., display panel 330 in FIG. 3) according to various embodiments may be set based on a user input through the user interface 800. For example, the user interface 800 may be displayed in response to a touch drag input moving downward from the top of the screen and may include a luminance scroll bar 810 movable in a horizontal direction. According to an embodiment, the electronic device 101 may increase or decrease the luminance setting value of the display panel 330 in response to a user input that moves a handler 811 included in the luminance scroll bar 810 in a horizontal direction. For example, the electronic device 101 may increase the luminance setting value of the display panel 330 in response to a user input for moving the handler 811 in a right direction, and may decrease the luminance setting value of the display panel 330 in response to a user input for moving the handler 811 in a left direction.

According to an embodiment, when the handler 811 is moved to the end in the right direction by user input, the electronic device 101 may control the luminance setting value of the display panel 330 to a first reference luminance (e.g., K1 in FIG. 11) which may be the maximum brightness that can be manually set by the user. According to an embodiment, when an illuminance value corresponding to an outdoor environment is sensed through the illuminance sensor (e.g., illuminance sensor 311 in FIG. 3) or the handler 811 is moved to the end in the right direction by user input, the electronic device 101 may transition to a high brightness mode (HBM) state where the luminance setting value is adjusted to a value greater than or equal to the first reference luminance (e.g., K1 in FIG. 11). According to an embodiment, in the HBM state, based on an illuminance sensing value obtained through the illuminance sensor 311, the electronic device 101 may automatically perform an operation of adjusting the luminance setting value of the display panel 330 to a value greater than or equal to the first reference luminance (e.g., K1 in FIG. 11). According to an embodiment, the HBM state is a state where the user is not allowed to manually adjust the luminance setting value of the display panel 330, and may be a state where the electronic device 101 adjusts the luminance setting value of the display panel 330 to a value greater than or equal to the first reference luminance (e.g., K1 in FIG. 11) based on an illuminance sensing value obtained through the illuminance sensor 311.

According to an embodiment, the electronic device 101 may transition the display panel 330 to the HBM state when the fingerprint sensor (e.g., fingerprint sensor 312 in FIG. 3) is operating to thereby improve the signal-to-noise ratio (SNR) of the fingerprint sensor 312.

Figure 9:
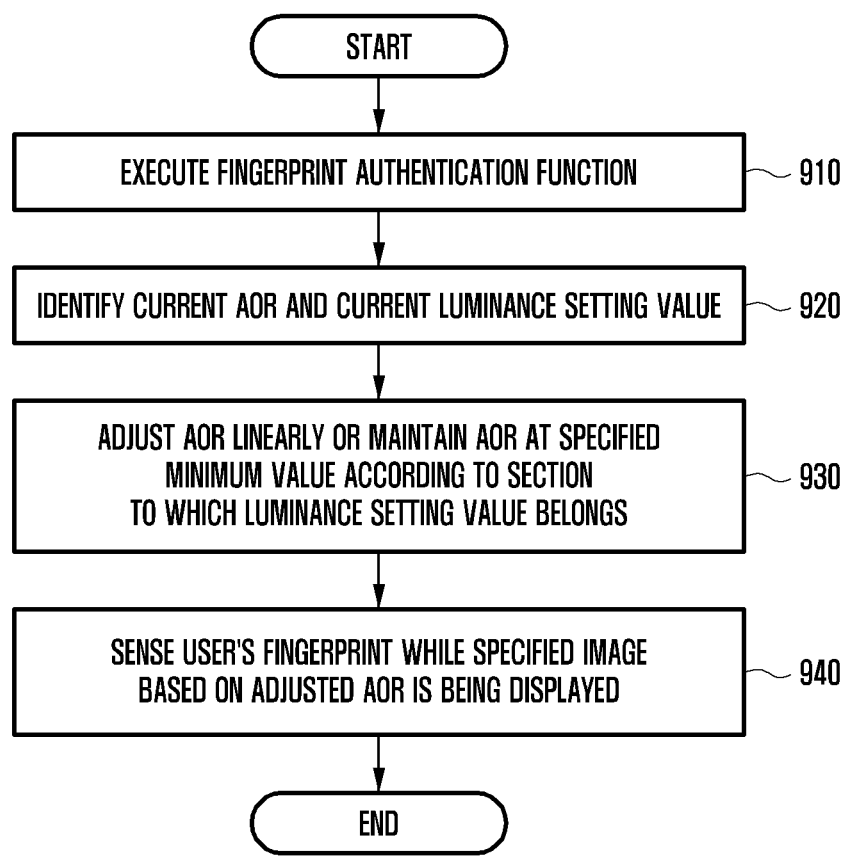
FIG. 9 is a flowchart illustrating operations of an electronic device according to an example embodiment.

FIG. 9 is a flowchart illustrating operations of an electronic device 101 according to an embodiment.

Figure 10:
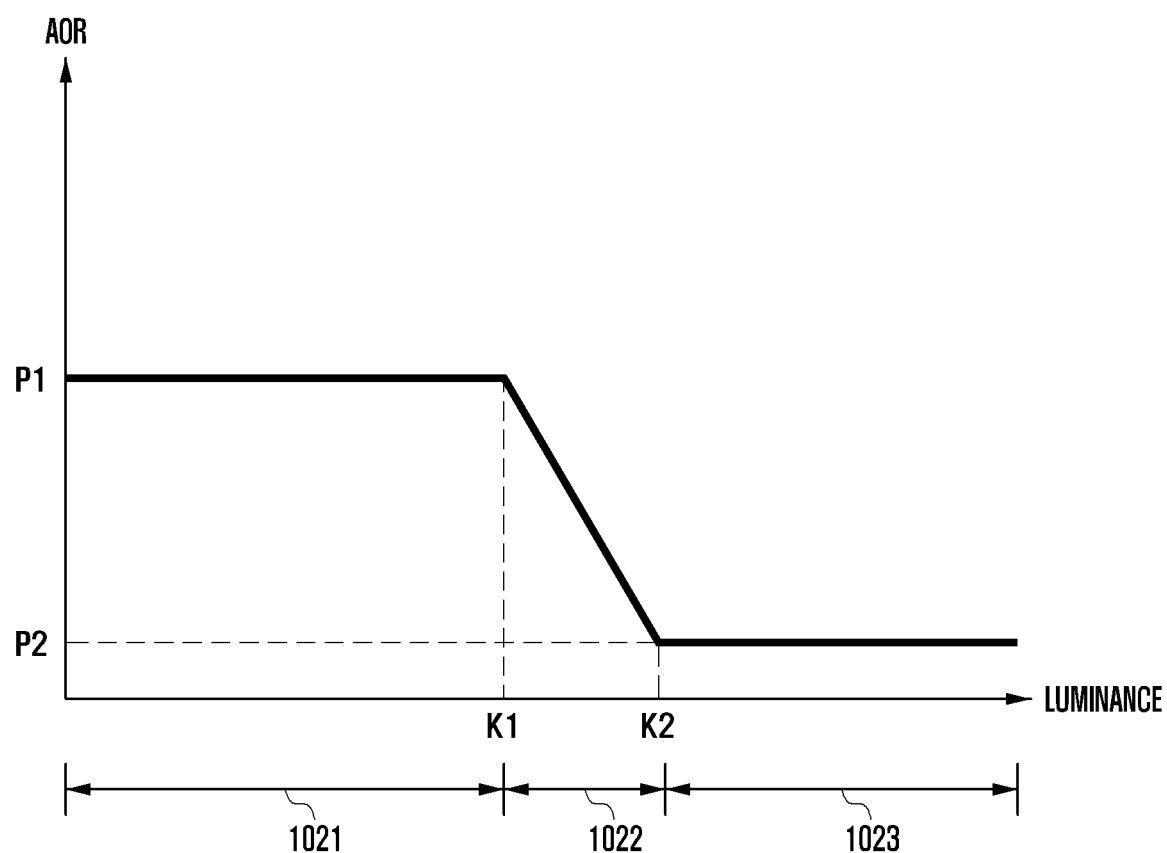
FIG. 10 illustrates parameters for an electronic device to adjust the AOR of a display panel according to an example embodiment.

FIG. 10 illustrates parameters for the electronic device 101 to adjust the AOR of the display panel (e.g., display panel 330 in FIG. 3) according to an embodiment. In FIG. 10, the horizontal axis may represent the luminance of the display panel 330, and the vertical axis may represent the AOR value of the display panel 330. A first section 1021 indicated by '1021' in FIG. 10 may correspond to a normal brightness section 1110 in FIG. 11 where brightness settings can be adjusted based on user input. A second section 1022 indicated by '1022' in FIG. 10 may correspond to an HBM section 1120 in FIG. 11 where the AOR is linearly adjusted. A third section 1023 indicated by '1023' in FIG. 10 may correspond to the HBM section 1120 in FIG. 11 where the AOR is maintained at a specified minimum value (e.g., P2 in FIG. 10).

Figure 11:
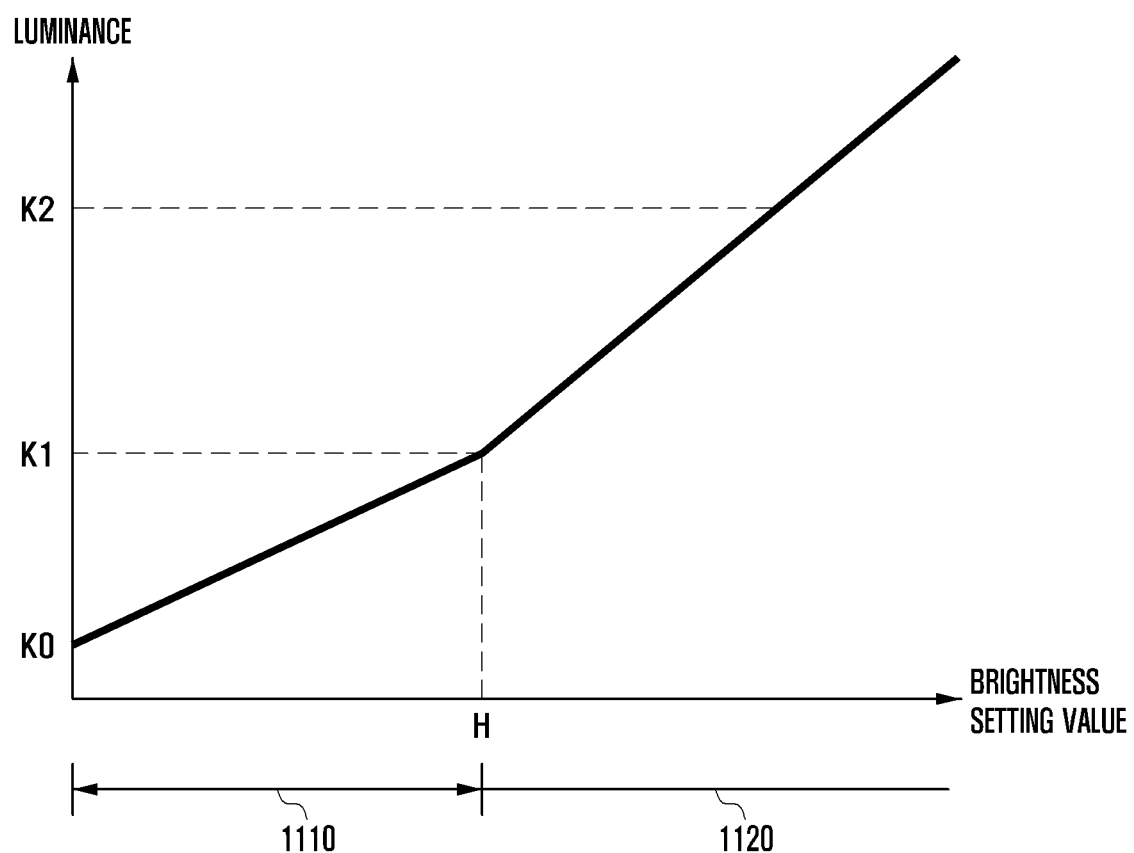
FIG. 11 illustrates the luminance of the display panel in correspondence to a brightness setting value of the electronic device described in FIG. 10 according to an example embodiment.

FIG. 11 illustrates the luminance of the display panel 330 in correspondence to a brightness setting value of the electronic device 101 described in FIG. 10 according to an embodiment. In FIG. 11, the horizontal axis may represent the brightness setting value of the display panel 330, and the vertical axis may represent the luminance of the display panel 330 of the electronic device 101. The normal brightness section 1110 indicated by '1110' in FIG. 11 may be a section where brightness settings can be adjusted based on user input. The HBM section 1120 indicated by '1120' in FIG. 11 may be a section corresponding to the HBM state and may be 44ectionn where the user is not allowed to adjust the brightness setting through user input.

At least some of the operations shown in FIG. 9 may be skipped. Before or after at least some of the operations shown in FIG. 9, at least some of the operations mentioned with reference to other drawings (e.g., FIG. 15) in the disclosure may be added.

The operations shown in FIG. 9 may be executed by the processor 120 (e.g., processor 120 in FIG. 1). For example, the memory (e.g., memory 130 in FIG. 1) of the electronic device (e.g., electronic device 101 in FIG. 1) may store instructions that, when executed, cause the processor 120 to perform at least some of the operations shown in FIG. 9.

At operation 910, the electronic device 101 according to an embodiment may execute a fingerprint authentication function. According to an embodiment, the execution of the fingerprint authentication function by the electronic device 101, as disclosed in Table 1, may be initiated by sensing a touch input to the fingerprint region (e.g., fingerprint region 1510 in FIG. 15), which is at least a portion of the display panel 330 overlapping the fingerprint sensor (e.g., fingerprint sensor 312 in FIG. 3), when the display panel 330 is in an inactive locked state (e.g., idle state). According to an embodiment, the execution of the fingerprint authentication function by the electronic device 101, as disclosed in Table 1, may be initiated based on a user input in a state of displaying a screen of a specific application.

At operation 920, the electronic device 101 according to an embodiment may identify the current AOR and the current luminance setting value in response to execution of the fingerprint authentication function. According to an embodiment, the electronic device 101 may identify which section among preset sections the current luminance setting value belongs to. For example, the preset sections may include the first section 1021, the second section 1022, or the third section 1023 as shown in FIG. 10.

According to an embodiment, the first section 1021, as a section where user's manipulation is allowed through a user interface (e.g., user interface 800 in FIG. 8), may be a section in which the luminance setting value is less than the first reference luminance (e.g., K1 in FIG. 10). According to an embodiment, the first reference luminance (e.g., K1 in FIG. 10) may be about 420 nit, but the disclosure may be not limited thereto.

According to an embodiment, the second section 1022, as a section corresponding to the HBM state, may be a section where the luminance setting value is greater than or equal to the first reference luminance (e.g., K1 in FIG. 10) and is less than a second reference luminance (e.g., K2 in FIG. 10). According to an embodiment, the second reference luminance (e.g., K2 in FIG. 10) may be about 500 nit, but the disclosure may be not limited thereto.

According to an embodiment, the third section 1023, as a section corresponding to the HBM state, may be a section where the luminance setting value is greater than or equal to the second reference luminance (e.g., K2 in FIG. 10). According to an embodiment, the luminance setting value of the third section 1023 may be set from about 500 nit to about 800 nit.

According to an embodiment, the first section 1021 is a section where the user is allowed to adjust the luminance setting value through user input, and the electronic device 101 may adjust the luminance setting value to a value corresponding to the first section 1021 based on a user input through the user interface 800.

According to an embodiment, the second section 1022 and/or the third section 1023 may be a section where the user is not allowed to adjust the luminance setting value through user input, and may be a section where the electronic device 101 automatically adjusts the luminance setting value.

At operation 930, the electronic device 101 according to an embodiment may linearly adjust the AOR or maintain the AOR at a specified minimum value (e.g., P2 in FIG. 10) according to the section to which the luminance setting value belongs. For example, when the fingerprint authentication function is executed, the electronic device 101 may linearly adjust the AOR if the luminance setting value belongs to the first section 1021 or the second section 1022. For example, when the fingerprint authentication function is executed, the electronic device 101 may set the AOR to a specified minimum value (e.g., P2 in FIG. 10) if the luminance setting value belongs to the third section 1023. Next, specific examples are described.

According to an embodiment, if the luminance setting value belongs to the first section 1021 less than the first reference luminance at which the user can manipulate the brightness through the user interface 800, the electronic device 101 may set the AOR to a specified maximum or large value (e.g., P1). According to an embodiment, while the fingerprint authentication function is not executed, if the luminance setting value belongs to the first section 1021 less than the first reference luminance at which user's manipulation is allowed through the user interface 800, the electronic device 101 may maintain the AOR at a specified maximum value (e.g., P1 in FIG. 10). According to an embodiment, when the fingerprint authentication function is executed, if the luminance setting value belongs to the first section 1021, the electronic device 101 may change the luminance setting value from the first section 1021 to the second section 1022 corresponding to the HBM state, and may linearly adjust the AOR from a specified maximum value (e.g., P1 in FIG. 10) to a specified minimum value (e.g., P2 in FIG. 10) as the luminance setting value increases.

With reference to FIG. 11, the electronic device 101 according to an embodiment linearly adjusts the AOR in the HBM section 1120 corresponding to the HBM state, which can prevent or reduce screen flickering due to a rapid change in luminance of the display panel 330 during a transition between the HBM section 1120 and the normal brightness section 1110. The normal brightness section 1110 may be a section where the user is allowed to manipulate the brightness setting value through the user interface 800, and may be a section having a brightness setting value less than or equal to a specified high value H.

The HBM section 1120 may be a section corresponding to the HBM state and may be a section having a brightness setting value greater than the specified high value H. As the electronic device 101 according to an embodiment linearly adjusts the AOR in the HBM section 1120 corresponding to the HBM state, it can continuously control the luminance of the display panel 330 at the boundary between the HBM section 1120 and the normal brightness section 1110, which can prevent or reduce flickering of the screen due to a rapid change in luminance of the display panel 330. For example, in the normal brightness section 1110, the electronic device 101 may control the luminance of the display panel 330 to a value between K0 (e.g., about 2 nit) and K1 (e.g., about 420 nit). For example, in the HBM section 1120, the electronic device 101 may control the luminance to a value between K1 (e.g., about 420 nit) and K2 (e.g., about 800 nit).

According to an embodiment, if the luminance setting value belongs to the second section 1022 where the user is not allowed to manipulate the brightness through the user interface 800, the electronic device 101 may set the AOR to a value between a specified maximum value (e.g., P1) and a specified minimum value (e.g., P2 in FIG. 10). According to an embodiment, when the fingerprint authentication function is not executed, if the luminance setting value belongs to the second section 1022 being greater than or equal to the first reference luminance K1 and less than the second reference luminance K2, the electronic device 101 may set the AOR to a value between a specified maximum value (e.g., P1) and a specified minimum value (e.g., P2 in FIG. 10) and linearly adjust the AOR in inverse proportion to the luminance setting value. According to an embodiment, when the fingerprint authentication function is executed, if the luminance setting value belongs to the second section 1022, the electronic device 101 may linearly adjust the AOR from a specified maximum value (e.g., P1 in FIG. 10) to a specified minimum value (e.g., P2 in FIG. 10) as the luminance setting value increases. For example, in the second section 1022, the electronic device 101 may lower the AOR as the luminance setting value increases, and may set the AOR to converge to a specified minimum value (e.g., P2 in FIG. 10) as the luminance setting value converges to a specified minimum value (e.g., P2 of FIG. 10).

According to an embodiment, if the luminance setting value belongs to the third section 1023 where user's manipulation is not allowed through the user interface 800, the electronic device 101 may set the AOR to a specified minimum value (e.g., P2 in FIG. 10). According to an embodiment, when the fingerprint authentication function is not executed, if the luminance setting value belongs to the third section 1023 being greater than or equal to the second reference luminance K2, the electronic device 101 may maintain the AOR at a specified value such as a specified minimum value (e.g., P2 in FIG. 10). According to an embodiment, when the fingerprint authentication function is executed, if the luminance setting value belongs to the third section 1023, the electronic device 101 may maintain the AOR at a specified minimum value (e.g., P2 in FIG. 10).

At operation 940, the electronic device 101 according to an embodiment may sense the user's fingerprint through the fingerprint sensor 312 while a specified image is being displayed based on the adjusted AOR. Here, the user's fingerprint information obtained by the electronic device 101 may include at least one piece of data generated as light output through the display panel 330 is reflected by a user's finger in a state where the AOR is adjusted to a specified minimum value (e.g., P2 in FIG. 10).

According to an embodiment, after performing fingerprint authentication of the user through the fingerprint sensor 312, the electronic device 101 may change the luminance setting value to one of the first to third sections (e.g., 1021, 1022, 1023 in FIG. 10) according to user input or external illuminance.

Figure 12:
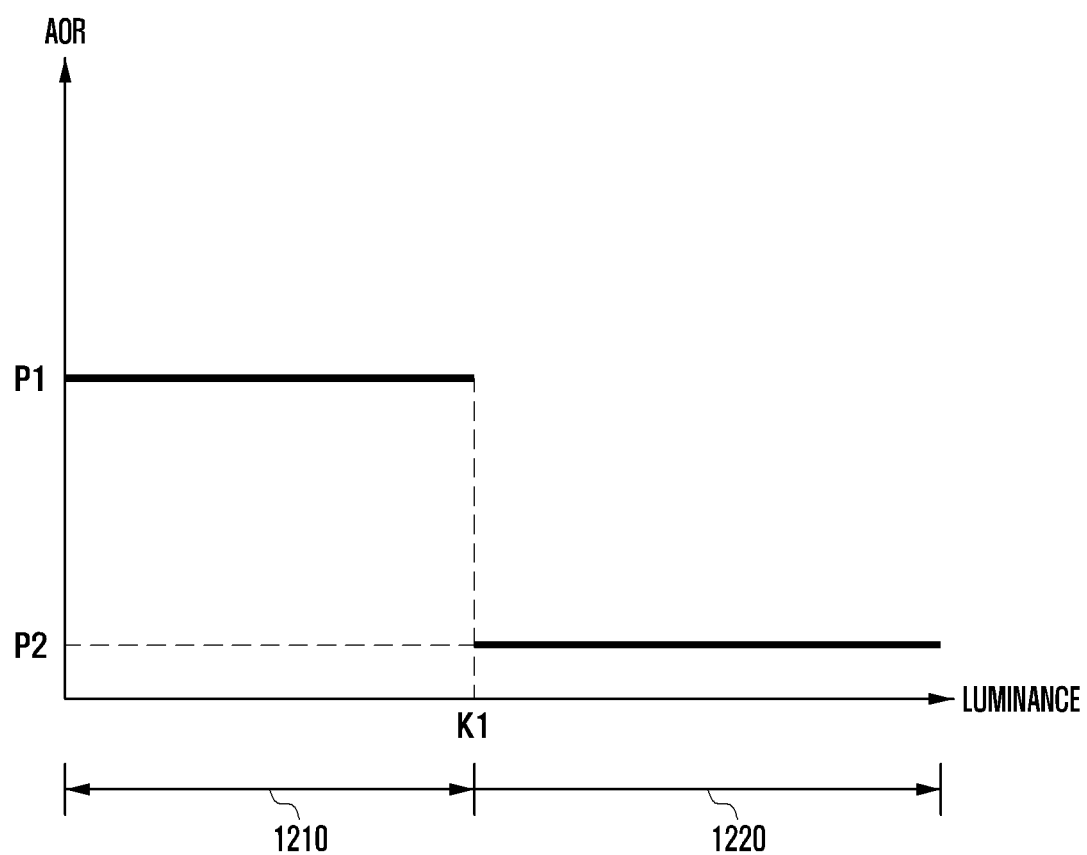
FIG. 12 illustrates parameters for an electronic device to adjust the AOR of a display panel according to a comparative example.

FIG. 12 illustrates parameters for an electronic device to adjust the AOR of the display panel 330 according to a comparative example. In FIG. 12, the horizontal axis may represent the luminance of the display panel 330 according to a comparative example, and the vertical axis may represent the AOR value of the display panel 330 according to a comparative example. In FIG. 12, the section indicated by '1210' may be a section corresponding to the normal brightness section 1210. In FIG. 12, the section indicated by '1220' may be a section corresponding to the HBM section 1220.

Figure 13:
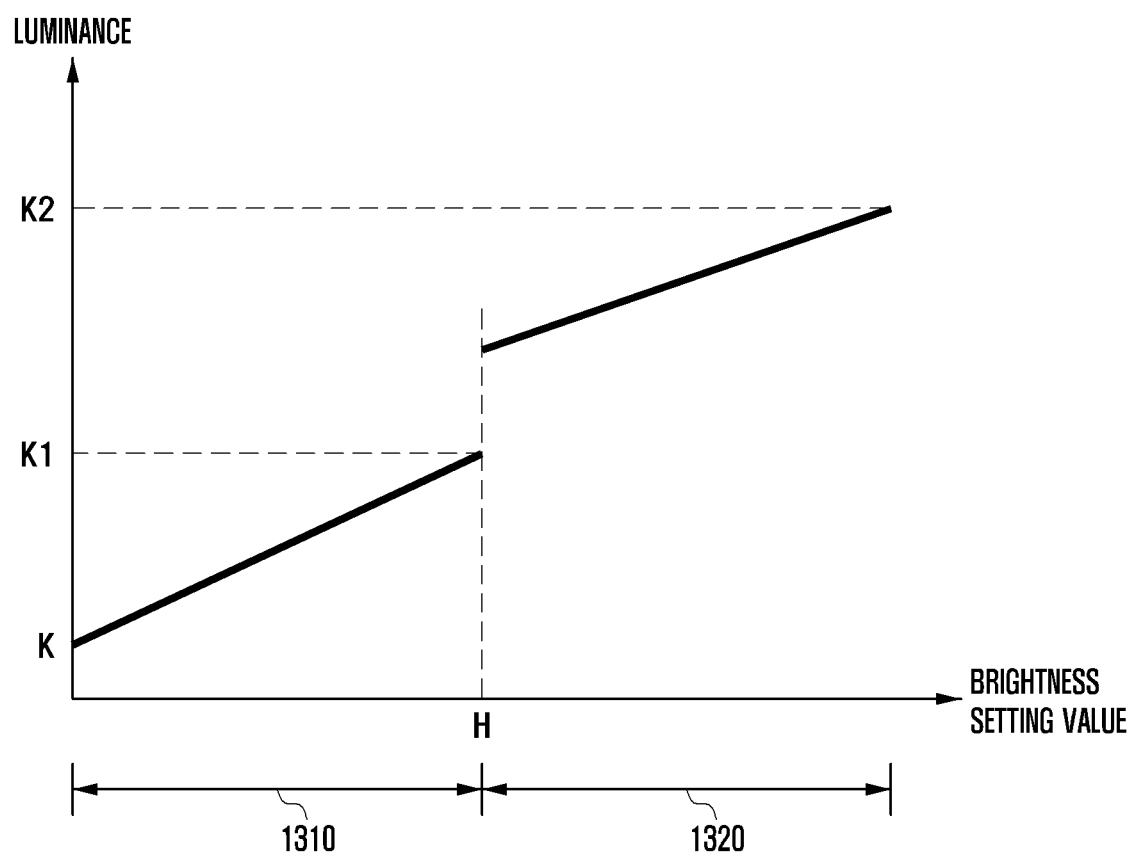
FIG. 13 illustrates the luminance of the display panel in correspondence to the AOR of the electronic device described in FIG. 12 according to a comparative example.

FIG. 13 illustrates the luminance of the display panel 330 in correspondence to the AOR of the electronic device 101 described in FIG. 12 according to a comparative example. In FIG. 13, the horizontal axis may represent the brightness setting value of the display panel 330 according to a comparative example, and the vertical axis may represent the luminance of the display panel 330 according to a comparative example. The normal brightness section 1310 indicated by '1310' in FIG. 13 may be a section where brightness settings can be adjusted based on user input. The HBM section 1320 indicated by '1320' in FIG. 13 may be a section corresponding to the HBM state and may be a section where the user is not allowed to adjust brightness settings through user input.

With reference to FIG. 12, the electronic device 101 according to a comparative example may set and maintain the AOR at a specified value P1 in the section 1210 corresponding to the normal brightness section 1210, and may set and maintain the AOR at P2 which is less than the specified value P1 in the section 1220 corresponding to the HBM section 1220. This electronic device 101 according to a comparative example may adjust the AOR nonlinearly and discontinuously at the boundary between the section 1210 and the section 1220, which corresponds to the boundary between the normal brightness section 1210 and the HBM section 1220. For example, when transitioning from the normal brightness section 1210 to the HBM section 1220, the electronic device 101 according to a comparative example may abruptly change the AOR from P1 to P2. In this electronic device 101 according to a comparative example, as shown in FIG. 13, the luminance of the display panel 330 may change abruptly and discontinuously at the boundary between the section 1310 and the section 1320, which corresponds to the boundary between the normal brightness section 1310 and the HBM section 1320, and a defect in which flickering is recognized by the user may occur.

In general, in the HBM section 1220, the display panel 330 uses a single gamma, and the single gamma may be set to output maximum brightness (e.g., about 800 nits). Hence, when the AOR is adjusted non-linearly and discontinuously at the boundary between the section 1210 and the section 1220, as in the electronic device 101 according to a comparative example, a situation where flicker is recognized by the user may occur. As described in conjunction with FIGS. 10 and 11, the electronic device 101 according to an embodiment can prevent or reduce a chance of a situation in which flicker is recognized by the user by linearly adjusting the AOR.

Figure 14:
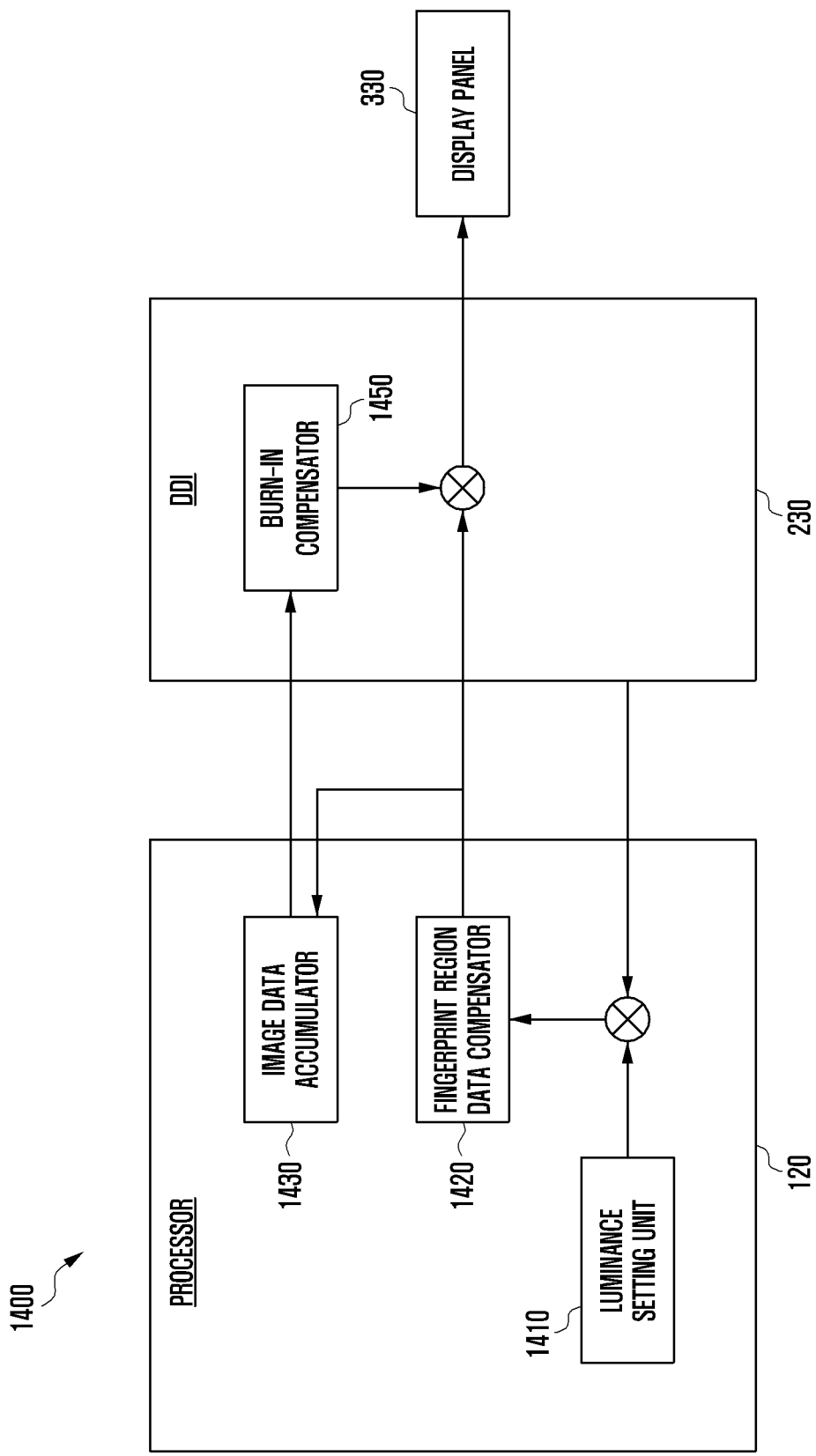
FIG. 14 is a block diagram of an electronic device for compensating for burn-in of a fingerprint region according to an example embodiment.

FIG. 14 is a block diagram of an electronic device 1400 for compensating for burn-in of a fingerprint region 1510 (e.g., see FIG. 15) according to an embodiment. The electronic device 1400 shown in FIG. 14 may include an embodiment identical to or similar to at least one of the electronic device 101 of FIG. 1, the electronic device 300 of FIG. 3, the electronic device 400/500 of FIGS. 4 and 5, or the electronic device 600 of FIG. 6.

Figure 15:
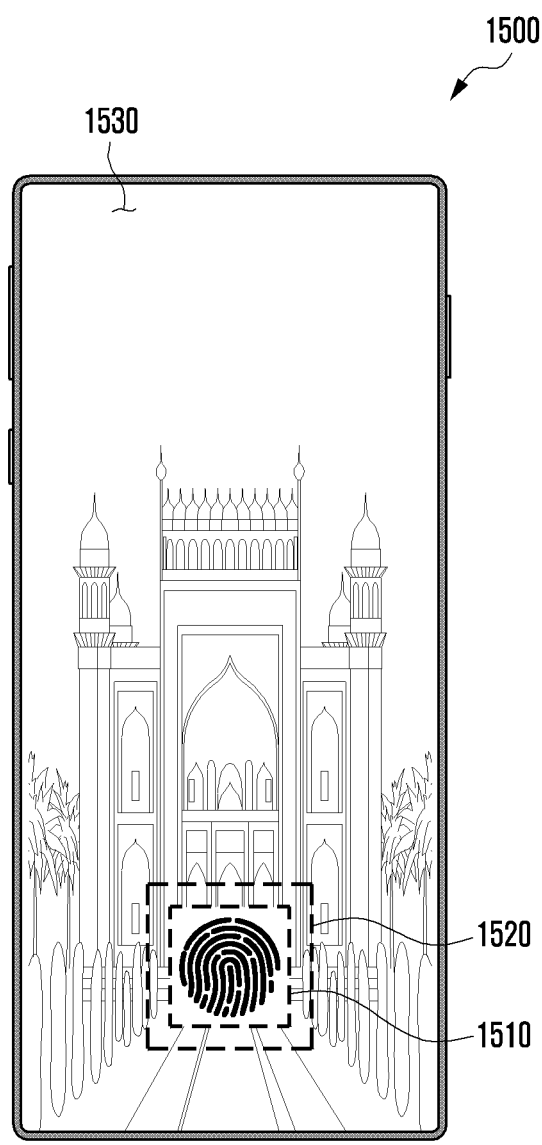
FIG. 15 is an illustration depicting a fingerprint region and a surrounding region of an electronic device according to an example embodiment.

FIG. 15 is an illustration depicting a fingerprint region 1510 and a surrounding region 1520 of the electronic device 1500 according to an embodiment.

Figure 16:
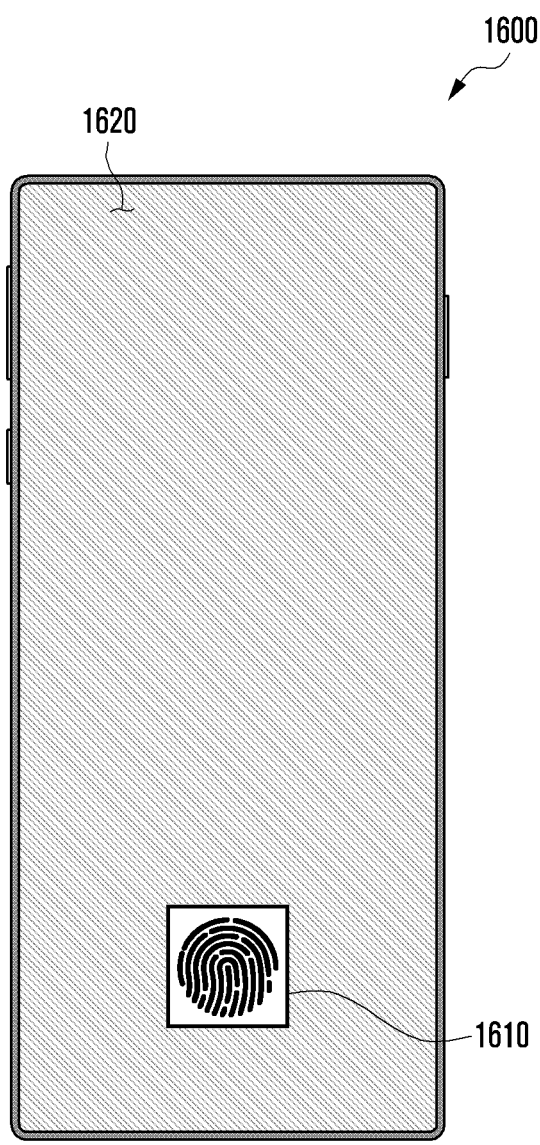
FIG. 16 is an illustration of a mask set by an electronic device to compensate for burn-in of the fingerprint region according to an example embodiment.

FIG. 16 is an illustration of a mask set by the electronic device 1400 to compensate for burn-in of the fingerprint region 1510 according to an embodiment.

Figure 17:
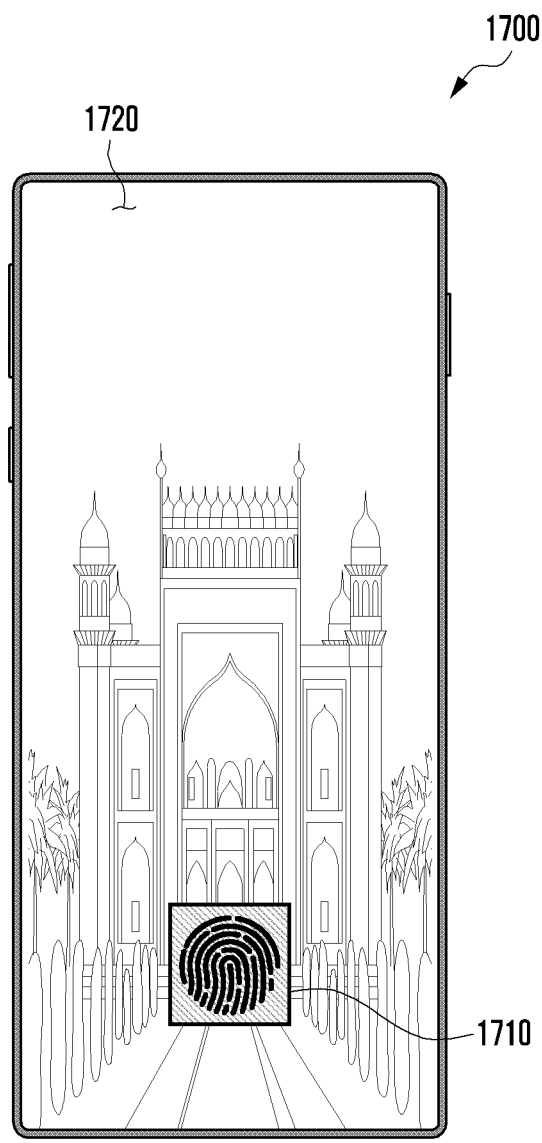
FIG. 17 illustrates an image obtained by an electronic device after compensating for burn-in of the fingerprint region according to an example embodiment.

FIG. 17 illustrates an image obtained by the electronic device 1400 after compensating for burn-in of the fingerprint region 1510 according to an embodiment.

Next, a detailed description is given of the electronic device 1400 capable of compensating for burn-in of the fingerprint region 1510 according to an embodiment in conjunction with FIGS. 14 to 17.

With reference to FIG. 14, in the electronic device 1400 according to an embodiment, the processor 120 may include a luminance setting unit 1410, a fingerprint region data compensator 1420, and/or an image data accumulator 1430. In the electronic device 1400 according to an embodiment, the DDI 230 may include a burn-in compensator 1450.

In the electronic device 1400 according to an embodiment, among the display area of the display panel (e.g., display panel 330 in FIG. 3), a region overlapping at least a portion of the fingerprint sensor (e.g., fingerprint sensor 312 in FIG. 3) may be set as "fingerprint region 1510". In the electronic device 1400 according to an embodiment, among the display area of the display panel 330, a region disposed outside the fingerprint region 1510 and within a specified distance from the fingerprint region 1510 may be set as "surrounding region 1520". For example, the surrounding region 1520 may be disposed to surround the outside of the fingerprint region 1510. For instance, '1530' in FIG. 15 may indicate the display area of the display panel 330 according to an embodiment. In FIG. 15, '1510' may indicate "fingerprint region 1510" being a region overlapping at least a portion of the fingerprint sensor 312 among the display area of the display panel 330. '1520' in FIG. 15 may indicate "surrounding region 1520" disposed to surround the fingerprint region 1510 of the display panel 330. '1530' in FIG. 15 may indicate a specified image displayed on the display area of the display panel 330. According to an embodiment, the specified image may be one of a background image based on a default or user settings, a lock screen, and an execution screen of a designated application of the electronic device 1400.

According to an embodiment, the luminance setting unit 1410 of the processor 120 may adjust screen brightness based on external illuminance of the electronic device 1400 obtained by using the illuminance sensor (e.g., illuminance sensor 311 in FIG. 3). For example, the luminance setting unit 1410 may increase visibility by setting the screen to be dark in a dark environment with low external illuminance and by setting the screen to be bright in a bright environment with high external illuminance. According to an embodiment, the luminance setting unit 1410 may output a luminance setting value based on external illuminance.

According to an embodiment, the fingerprint region data compensator 1420 of the processor 120 may be activated in response to execution of the fingerprint authentication function. According to an embodiment, the fingerprint region data compensator 1420 of the processor 120 may receive a luminance setting value based on external illuminance from the luminance setting unit 1410. The fingerprint region data compensator 1420 may obtain image data to be displayed through the surrounding region 1520. For example, the fingerprint region data compensator 1420 may receive image data to be displayed through the surrounding region 1520 from an image generator (not shown) that generates (e.g., renders) a frame image. In a certain embodiment, the fingerprint region data compensator 1420 may receive image data to be displayed through the surrounding region 1520 from the DDI 230.

According to an embodiment, the fingerprint region data compensator 1420 may determine a conversion offset for adjusting the luminance of the fingerprint region 1510 based on a luminance setting value and image data to be displayed through the surrounding region 1520. The fingerprint region data compensator 1420 may adjust the luminance of the fingerprint region 1510 based on the determined conversion offset. For example, when the average gray level of image data to be displayed through the fingerprint region 1510 is a gray level of about 255, the luminance of the fingerprint region 1510 may be about 800 nits. The fingerprint region data compensator 1420 may, for example, lower the average gray level of the fingerprint region 1510 from a gray level of about 255 to a gray level of about 220 and adjust it to have a luminance of about 578 nits by applying a conversion offset corresponding to a gray level of 35 to a gray level of about 255.

In general, the optical fingerprint sensor 312 may require a light source of about 500 nits or more for the display panel 330. To improve the performance of the fingerprint sensor 312, the electronic device 1400 according to an embodiment may set the AOR of the display panel 330 to a minimum value (e.g., P2 in FIG. 10, about 2 percent), and may drive the brightness of the display panel 330 in a maximum HBM state (e.g., HBM max state). The electronic device 1400 according to an embodiment may set a conversion offset in order to reduce a burn-in deviation due to a luminance difference between the fingerprint region 1510 of the display panel 330 used as a light source of the display panel 330 and the surrounding region 1520 disposed around the fingerprint region 1510, and may lower the gray level and luminance of the fingerprint region 1510 based on the set conversion offset. For example, when the luminance difference between the fingerprint region 1510 of the display panel 330 used as a light source of the display panel 330 and the surrounding region 1520 disposed around the fingerprint region 1510 is relatively large, a deviation between characteristics (e.g., lifespan properties) of pixels 331 corresponding to the fingerprint region 1510 and characteristics (e.g., lifespan properties) of pixels 331 corresponding to the surrounding region 1520 may increase, and defects in image quality may occur due to burn-in deviation. The electronic device 1400 according to various embodiments may apply a conversion offset to the fingerprint region 1510 in response to execution of the fingerprint authentication function so as to reduce a luminance difference between the fingerprint region 1510 and the surrounding region 1520. Thereby, the electronic device 1400 according to various embodiments can reduce image quality defects due to a deviation between characteristics (e.g., lifespan properties) of pixels 331 corresponding to the fingerprint region 1510 and characteristics (e.g., lifespan properties) of pixels 331 corresponding to the surrounding region 1520.

According to an embodiment, adjusting the luminance (or, gray level) of the fingerprint region 1510 depending upon execution of the fingerprint authentication function in the electronic device 1400 may be performed by the processor 120. For example, the processor 120 may receive data corresponding to the average luminance (or, average gray level) of the surrounding region 1520 located around the fingerprint region 1510 from the DDI 230. The processor 120 may determine a conversion offset based on the received data and the current luminance setting value, and generate a frame image in which the luminance (or average gray level) of the fingerprint region 1510 is changed based on the conversion offset. According to an embodiment, in the generated frame image, the luminance of the fingerprint region 1510 may be changed based on the conversion offset, and the luminance of the remaining region other than the fingerprint region 1510 may be maintained in correspondence to the current luminance setting value. For example, the electronic device 1400 may execute the fingerprint authentication function while driving the display panel 330 in a maximum HBM state (e.g., HBM max state). In response to execution of the fingerprint authentication function, the electronic device 1400 may control the display panel 330 to lower the luminance of the fingerprint region 1510 based on the conversion offset, and may control the display panel 330 to output a luminance corresponding to the maximum HBM state (e.g., HBM max state) in the remaining region other than the fingerprint region 1510.

According to an embodiment, in response to execution of the fingerprint authentication function, the processor 120 may directly lower the gray level of the frame image to lower the luminance of the fingerprint region 1510, or may perform mask processing applicable only to the fingerprint region 1510 of the frame image on the frame image. For example, the processor 120 may directly convert grayscale data corresponding to the fingerprint region 1510 based on the conversion offset. For instance, when the average gray level of the fingerprint region 1510 is a gray level of about 255, the processor 120 may directly convert the grayscale values of data supplied to pixels 331 of the fingerprint region 1510 so as to lower the average gray level of the fingerprint region 1510 from a gray level of about 255 to a gray level of about 220 and adjust the luminance thereof to about 578 nits. For example, the processor 120 may apply mask processing applicable only to the fingerprint region 1510 to the frame image based on the conversion offset. For instance, as shown in FIG. 16, the mask 1600 may include a conversion region 1610 set in correspondence to the fingerprint region 1510 and subjected to image processing corresponding to the conversion offset, and a masking region 1620 excluding the conversion region 1610. For example, when the average gray level of the fingerprint region 1510 is a gray level of about 255, the processor 120 may perform mask processing through the conversion region 1610 of the mask 1600 so as to lower the average gray level of the fingerprint region 1510 from a gray level of about 255 to a gray level of about 220 and adjust the luminance thereof to about 578 nits. According to an embodiment, as shown in FIG. 17, in the frame image 1700 converted by the processor 120, the luminance of the fingerprint region 1710 (e.g., fingerprint region 1510 in FIG. 15) may be changed based on the conversion offset, and the luminance of the remaining region 1720 other than the fingerprint region 1710 may be maintained at a luminance corresponding to the current luminance setting value.

According to an embodiment, the mask processing may include an operation of performing first mask processing on the remaining region other than the fingerprint region 1510 and performing second mask processing on the entire region including the fingerprint region 1510 to lower luminance. According to an embodiment, second mask processing may be set in correspondence to a region smaller than the entire region including the fingerprint region 1510.

According to an embodiment, adjusting the luminance (or, gray level) of the fingerprint region 1510 depending upon execution of the fingerprint authentication function in the electronic device 1400 may be performed by the DDI 230. For example, the DDI 230 may receive information related to execution of the fingerprint authentication function and the current luminance setting value from the processor 120. The DDI 230 may determine a conversion offset based on the received information, and generate a frame image in which the luminance (or, average gray level) of the fingerprint region 1510 is changed based on the conversion offset. According to an embodiment, in the generated frame image, the luminance of the fingerprint region 1510 may be changed based on the conversion offset, and the luminance of the remaining region other than the fingerprint region 1510 may be maintained in correspondence to the current luminance setting value.

According to an embodiment, in response to execution of the fingerprint authentication function, the DDI 230 may directly lower the gray level of the frame image to lower the luminance of the fingerprint region 1510, or may perform mask processing applicable only to the fingerprint region 1510 of the frame image on the frame image. For example, the DDI 230 may directly convert grayscale data corresponding to the fingerprint region 1510 based on the conversion offset. For instance, when the average gray level of the fingerprint region 1510 is a gray level of about 255, the DDI 230 may directly convert the grayscale values of data supplied to pixels 331 of the fingerprint region 1510 so as to lower the average gray level of the fingerprint region 1510 from a gray level of about 255 to a gray level of about 220 and adjust the luminance thereof to about 578 nits. For example, the DDI 230 may apply mask processing applicable only to the fingerprint region 1510 to the frame image based on the conversion offset. For instance, as shown in FIG. 16, the mask 1600 may include a conversion region 1610 set in correspondence to the fingerprint region 1510 and subjected to image processing corresponding to the conversion offset, and a masking region 1620 excluding the conversion region 1610. For example, when the average gray level of the fingerprint region 1510 is a gray level of about 255, the DDI 230 may perform mask processing through the conversion region 1610 of the mask 1600 so as to lower the average gray level of the fingerprint region 1510 from a gray level of about 255 to a gray level of about 220 and adjust the luminance thereof to about 578 nits. According to an embodiment, as shown in FIG. 17, in the frame image 1700 converted by the DDI 230, the luminance of the fingerprint region 1710 (e.g., fingerprint region 1510 in FIG. 15) may be changed based on the conversion offset, and the luminance of the remaining region 1720 other than the fingerprint region 1710 may be maintained at a luminance corresponding to the current luminance setting value.

According to an embodiment, the image data accumulator 1430 of the processor 120 may receive a frame image generated by the fingerprint region data compensator 1420 as an input. The image data accumulator 1430 may produce burn-in information of the display panel 330 by analyzing the frame image. For example, the image data accumulator 1430 may determine burn-in information reflecting lifespan characteristics of the display panel 330 in consideration of the usage time of the display panel 330 and/or frame images displayed through the display panel 330. The image data accumulator 1430 may transfer the determined burn-in information to the DDI 230. Upon receiving burn-in information from the image data accumulator 1430 of the processor 120, the burn-in compensator 1450 of the DDI 230 may determine compensation data based on the burn-in information. The compensation data may be data for compensating for a burn-in deviation due to a deviation in lifespan characteristics of pixels 331 of the display panel 330. The DDI 230 may apply the compensation data generated by the burn-in compensator 1450 to the frame image input from the processor 120 to generate a final frame image (e.g., frame image 1700 in FIG. 17), and may drive the display panel 330 to display the final frame image 1700.

Figure 18:
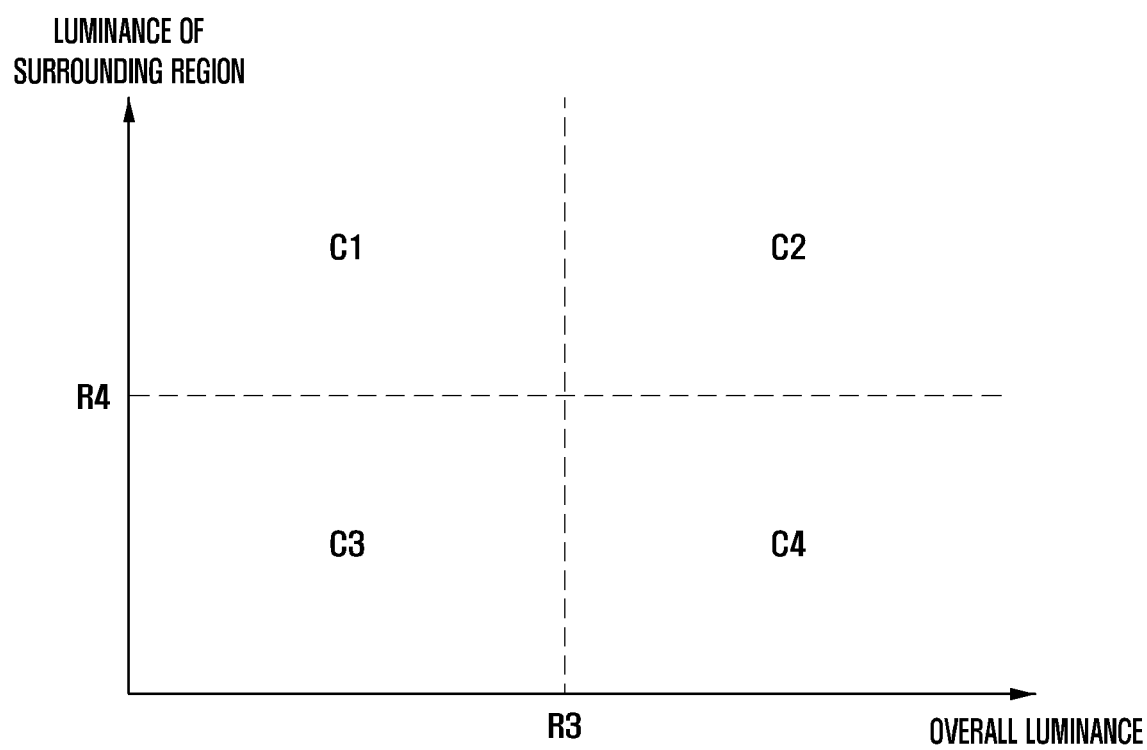
FIG. 18 illustrates classification of cases in terms of the overall luminance of the display panel and the luminance of the surrounding region according to an example embodiment.

FIG. 18 illustrates classification of cases in terms of the overall luminance of the display panel 330 and the luminance of the surrounding region 1520 according to an embodiment.

According to an embodiment, when the fingerprint authentication function is executed, the electronic device 101 may adjust the luminance of the fingerprint region 1510 based on the overall luminance of the display panel (e.g., display panel 330 in FIG. 3) and the luminance of the surrounding region 1520. For example, when the fingerprint authentication function is executed, the states of the display panel 330 may be classified into cases as shown in FIG. 18 according to the overall luminance of the display panel 330 and the luminance of the surrounding region 1520.

In FIG. 18, 'C1' may indicate a first case C1 (e.g., first state) where the overall luminance of the display panel 330 is less than or equal to third reference luminance R3, and the luminance of the surrounding region 1520 is greater than fourth reference luminance R4, when the fingerprint authentication function is executed.

In FIG. 18, 'C2' may indicate a second case C2 (e.g., second state) where the overall luminance of the display panel 330 is greater than third reference luminance R3, and the luminance of the surrounding region 1520 is greater than fourth reference luminance R4, when the fingerprint authentication function is executed.

In FIG. 18, 'C3' may indicate a third case C3 (e.g., third state) where the overall luminance of the display panel 330 is less than or equal to third reference luminance R3, and the luminance of the surrounding region 1520 is less than or equal to fourth reference luminance R4, when the fingerprint authentication function is executed.

In FIG. 18, 'C4' may indicate a fourth case C4 (e.g., fourth state) where the overall luminance of the display panel 330 is greater than third reference luminance R3, and the luminance of the surrounding region 1520 is less than or equal to fourth reference luminance R4, when the fingerprint authentication function is executed.

According to an embodiment, when the fingerprint authentication function is executed, the electronic device 101 may determine which case among the above cases the state of the display panel 330 belongs to, and adjust the luminance of the fingerprint region 1510 based on the corresponding case.

According to an embodiment, when the fingerprint authentication function is executed, if the state of the display panel 330 corresponds to the second case C2, the electronic device 101 may control the display panel 330 so that the fingerprint region 1510 outputs a luminance corresponding to a maximum HBM state (e.g., HBM max state).

According to an embodiment, when the fingerprint authentication function is executed, if the state of the display panel 330 corresponds to the first case C1 or fourth case C4, the electronic device 101 may control the display panel 330 so that the fingerprint region 1510 outputs a specified first luminance. For example, the first luminance may be about 300 nit, but the disclosure may be not limited thereto.

According to an embodiment, when the fingerprint authentication function is executed, if the state of the display panel 330 corresponds to the third case C3, the electronic device 101 may control the display panel 330 so that the fingerprint region 1510 outputs a second luminance lower than the first luminance. For example, the second luminance may be about 100 nit, but the disclosure may be not limited thereto.

Figure 19:
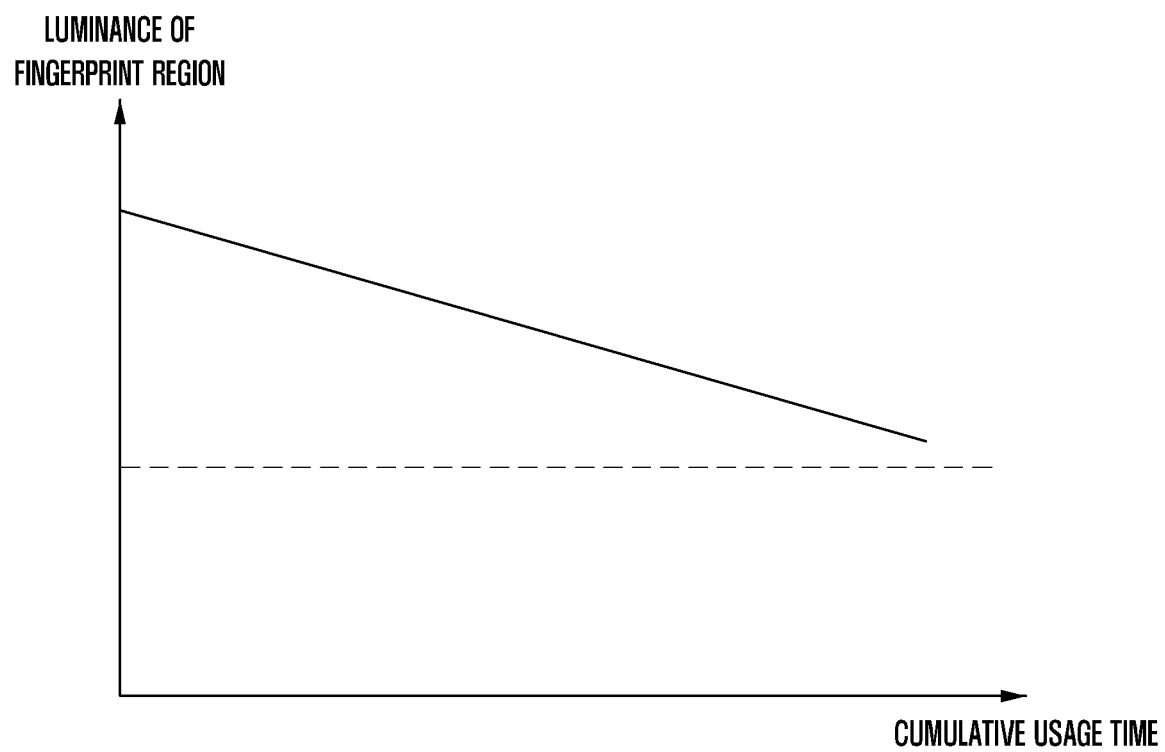
FIG. 19 illustrates parameters for an electronic device to set a target luminance based on the cumulative usage time of the display panel according to an example embodiment.

FIG. 19 illustrates parameters for the electronic device 101 to set a target luminance based on the cumulative usage time of the display panel 330 according to an embodiment. In FIG. 19, the horizontal axis may represent the cumulative usage time of the fingerprint sensor (e.g., fingerprint sensor 312 in FIG. 3), and the vertical axis may represent the luminance of the fingerprint region 1510.

With reference to FIG. 19, for the fingerprint region 1510 of the display panel 330 according to an embodiment, as the number of times of fingerprint authentication using the fingerprint sensor 312 increases, the lifetime decreases and the possibility of burn-in increases. Hence, the luminance of the fingerprint region 1510 of the electronic device 101 where the number of fingerprint authentication is relatively high may be darker than that of the fingerprint region 1510 of the electronic device 101 where the number of fingerprint authentication is relatively low. Considering that the luminance of the fingerprint region 1510 decreases as the number of fingerprint authentication using the fingerprint sensor 312 increases, when the fingerprint authentication function is executed, the electronic device 101 according to an embodiment may control the image data accumulator 1430 (e.g., image data accumulator 1430 in FIG. 14) or burn-in compensator 1450 (e.g., burn-in compensator 1450 in FIG. 14) for burn-in compensation to process image data to be displayed through the display panel 330. For example, the processor may accumulate and store data about an image in which the luminance of the fingerprint region 1510 is adjusted, and determine compensation data for compensating for burn-in of the display panel 330 based on the accumulated and stored data. The processor may prevent or reduce a chance of a burn-in phenomenon by changing image data displayed through the display panel 330 based on the determined compensation data.

FIG. 20 is a flowchart for the electronic device 101 to compensate for burn-in of the fingerprint region 1510.

At least some of the operations shown in FIG. 20 may be skipped. Before or after at least some of the operations shown in FIG. 20, at least some of the operations mentioned with reference to other drawings (e.g., FIG. 9) in the disclosure may be added.

The operations shown in FIG. 20 may be executed by the processor 120 (e.g., processor 120 in FIG. 1). For example, the memory (e.g., memory 130 in FIG. 1) of the electronic device 101 may store instructions that, when executed, cause the processor 120 to perform at least some of the operations shown in FIG. 20.

At operation 2010, when a fingerprint authentication function is executed, the electronic device 101 according to an embodiment may identify the current luminance setting value and the luminance of the surrounding region 1520. According to an embodiment, the fingerprint region data compensator 1420 of the processor 120 may be activated in response to execution of the fingerprint authentication function. According to an embodiment, the fingerprint region data compensator 1420 of the processor 120 may receive a luminance setting value based on external illuminance from the luminance setting unit 1410. The fingerprint region data compensator 1420 may obtain image data to be displayed through the surrounding region 1520. For example, the fingerprint region data compensator 1420 may receive image data to be displayed through the surrounding region 1520 from an image generator (not shown) that generates (e.g., renders) a frame image. In a certain embodiment, the fingerprint region data compensator 1420 may receive image data to be displayed through the surrounding region 1520 from the DDI 230.

At operation 2020, the electronic device 101 according to an embodiment may determine a conversion offset based on the current luminance setting value and the luminance of the surrounding region 1520. According to an embodiment, the fingerprint region data compensator 1420 of the processor 120 may determine a conversion offset for adjusting the luminance of the fingerprint region 1510 based on the luminance setting value and image data to be displayed through the surrounding region 1520.

At operation 2030, the electronic device 101 according to an embodiment may adjust the luminance of the fingerprint region 1510 based on the conversion offset. According to an embodiment, the fingerprint region data compensator 1420 of the processor 120 may adjust the luminance of the fingerprint region 1510 based on the determined conversion offset. For example, when the average gray level of image data to be displayed through the fingerprint region 1510 is a gray level of about 255, the luminance of the fingerprint region 1510 may be about 800 nits. The fingerprint region data compensator 1420 may, for example, lower the average gray level of the fingerprint region 1510 from a gray level of about 255 to a gray level of about 220 and adjust it to have a luminance of about 578 nits by applying a conversion offset corresponding to a gray level of 35 to a gray level of about 255.

According to an embodiment, adjusting the luminance (or, gray level) of the fingerprint region 1510 depending upon execution of the fingerprint authentication function in the electronic device 101 may be performed by the processor 120. For example, the processor 120 may receive data corresponding to the average luminance (or, average gray level) of the surrounding region 1520 located around the fingerprint region 1510 from the DDI 230. The processor 120 may determine a conversion offset based on the received data and the current luminance setting value, and generate a frame image in which the luminance (or average gray level) of the fingerprint region 1510 is changed based on the conversion offset.

According to an embodiment, adjusting the luminance (or, gray level) of the fingerprint region 1510 depending upon execution of the fingerprint authentication function in the electronic device 101 may be performed by the DDI 230. For example, the DDI 230 may receive information related to execution of the fingerprint authentication function and the current luminance setting value from the processor 120. The DDI 230 may determine a conversion offset based on the received information, and generate a frame image in which the luminance (or, average gray level) of the fingerprint region 1510 is changed based on the conversion offset.

According to an embodiment, in response to execution of the fingerprint authentication function, the processor 120 may directly lower the gray level of the frame image to lower the luminance of the fingerprint region 1510, or may perform mask processing applicable only to the fingerprint region 1510 of the frame image on the frame image.

According to an embodiment, when the fingerprint authentication function is executed, the electronic device 101 may adjust the luminance of the fingerprint region 1510 based on the overall luminance of the display panel (e.g., display panel 330 in FIG. 3) and the luminance of the surrounding region 1520. For example, when the fingerprint authentication function is executed, the states of the display panel 330 may be classified into cases as shown in FIG. 18 according to the overall luminance of the display panel 330 and the luminance of the surrounding region 1520; the electronic device 101 may adjust the luminance of the fingerprint region 1510 based on which case the state of the display panel 330 belongs to.

At operation 2040, the electronic device 101 according to an embodiment may sense the user's fingerprint while an image in which the luminance of the fingerprint region 1510 is adjusted is being displayed. For instance, when the average gray level of the fingerprint region 1510 is a gray level of about 255, the processor 120 may directly convert the grayscale values of data supplied to pixels 331 of the fingerprint region 1510 or apply mask processing so as to lower the average gray level of the fingerprint region 1510 from a gray level of about 255 to a gray level of about 220 and adjust the luminance thereof to about 578 nits. While the luminance of the fingerprint region 1510 is being adjusted, the processor 120 may sense the user's fingerprint through the fingerprint sensor (e.g., fingerprint sensor 312 in FIG. 3) and perform the fingerprint authentication function.

An electronic device 101 according to various embodiments may include: a display panel 330; a fingerprint sensor 312 disposed to overlap at least a portion of the display panel 330; and a processor 120 operably connected, directly or indirectly, to the display panel 330 and the fingerprint sensor 312, wherein the processor 120 may be configured to execute a fingerprint authentication function using the fingerprint sensor 312, identify the AMOLED off ratio (AOR) and luminance setting value of the display panel 330 in response to execution of the fingerprint authentication function, adjust the AOR linearly or set the AOR to a specified minimum value according to the section to which the luminance setting value belongs, and perform fingerprint authentication by using the fingerprint sensor 312 while the AOR is maintained at the minimum value.

According to an embodiment, the processor 120 may be configured to: lower the AOR linearly from a specified maximum value to the minimum value if the luminance setting value belongs to a first section being less than a first reference luminance when the fingerprint authentication function is executed; lower the AOR linearly to the minimum value if the luminance setting value belongs to a second section being greater than the first reference luminance and less than or equal to a second reference luminance when the fingerprint authentication function is executed, the second reference luminance being greater than the first reference luminance; and maintain the AOR at the minimum value if the luminance setting value belongs to a third section being greater than the second reference luminance when the fingerprint authentication function is executed.

According to an embodiment, the first section may be a normal brightness section where the brightness setting of the display panel 330 is adjusted based on user input; the second section and the third section may be a section where the user is not allowed to adjust the brightness setting of the display panel 330 based on user input and may be a high brightness mode (HBM) section where the electronic device 101 automatically adjusts the brightness of the display panel 330 by using an illuminance sensor.

According to an embodiment, while the AOR is maintained at the minimum value, the processor 120 may be configured to perform user authentication by using at least one piece of data generated as light output through the display panel 330 is reflected by a user's finger.

According to an embodiment, the display panel 330 may include a fingerprint region 1510 overlapping at least a portion of the fingerprint sensor 312 and a surrounding region disposed to surround the fingerprint region 1510; when the fingerprint authentication function is executed, the processor 120 may be configured to identify the luminance setting value of the display panel 330 and the luminance of the surrounding region, determine a conversion offset based on the luminance setting value and the luminance of the surrounding region, adjust the luminance of the fingerprint region 1510 based on the conversion offset, and perform fingerprint authentication by using the fingerprint sensor 312 while the display panel 330 displays an image in which the luminance of the fingerprint region 1510 is adjusted.

According to an embodiment, the processor 120 may directly lower grayscale values of data supplied to pixels of the fingerprint region 1510 based on the conversion offset.

According to an embodiment, the processor 120 may lower the luminance of the fingerprint region 1510 based on the conversion offset through mask processing applied only to the fingerprint region 1510 of a frame image supplied to the display panel 330.

According to an embodiment, the processor 120 may be configured to accumulate and store data about images in which the luminance of the fingerprint region 1510 is adjusted, and determine compensation data for compensating for burn-in of the display panel 330 based on the accumulated data.

According to an embodiment, when the fingerprint authentication function is executed, the processor 120 may change the luminance setting value of the fingerprint region 1510 based on the overall luminance of the display panel 330 and the luminance of the surrounding region.

According to an embodiment, when the fingerprint authentication function is executed, the processor 120 may be configured to: control the fingerprint region 1510 to output a first luminance in case of a first state where the overall luminance of the display panel 330 is less than or equal to a third reference luminance and the luminance of the surrounding region is greater than a fourth reference luminance; control the fingerprint region 1510 to output a maximum luminance in case of a second state where the overall luminance of the display panel 330 is greater than the third reference luminance and the luminance of the surrounding region is greater than the fourth reference luminance; control the fingerprint region 1510 to output a second luminance lower than the first luminance in case of a third state where the overall luminance of the display panel 330 is less than or equal to the third reference luminance and the luminance of the surrounding region is less than or equal to the fourth reference luminance; and control the fingerprint region 1510 to output the first luminance in case of a fourth state where the overall luminance of the display panel 330 is greater than the third reference luminance and the luminance of the surrounding region is less than or equal to the fourth reference luminance.

A method for an electronic device 101 including a fingerprint sensor 312 disposed to overlap at least a portion of a display panel 330 according to various embodiments may include: executing a fingerprint authentication function using the fingerprint sensor 312; identifying the AMOLED off ratio (AOR) and luminance setting value of the display panel 330 in response to execution of the fingerprint authentication function; adjusting the AOR linearly or setting the AOR to a specified minimum value according to the section to which the luminance setting value belongs; and performing fingerprint authentication by using the fingerprint sensor 312 while the AOR is maintained at the minimum value.

According to an embodiment, the method may include: lowering the AOR linearly from a specified maximum value to the minimum value if the luminance setting value belongs to a first section being less than a first reference luminance when the fingerprint authentication function is executed; lowering the AOR linearly to the minimum value if the luminance setting value belongs to a second section being greater than the first reference luminance and less than or equal to a second reference luminance when the fingerprint authentication function is executed, the second reference luminance being greater than the first reference luminance; and maintaining the AOR at the minimum value if the luminance setting value belongs to a third section being greater than the second reference luminance when the fingerprint authentication function is executed.

According to an embodiment, in the method, the first section may be a normal brightness section where the brightness setting of the display panel 330 is adjusted based on user input; the second section and the third section may be a section where the user is not allowed to adjust the brightness setting of the display panel 330 based on user input and may be a high brightness mode (HBM) section where the electronic device 101 automatically adjusts the brightness of the display panel 330 by using an illuminance sensor.

According to an embodiment, the method may include performing user authentication by using at least one piece of data generated as light output through the display panel 330 is reflected by a user's finger while the AOR is maintained at the minimum value.

According to an embodiment, the display panel 330 may include a fingerprint region 1510 overlapping at least a portion of the fingerprint sensor 312 and a surrounding region disposed to surround the fingerprint region 1510; when the fingerprint authentication function is executed, the method may further include identifying the luminance setting value of the display panel 330 and the luminance of the surrounding region, determining a conversion offset based on the luminance setting value and the luminance of the surrounding region, adjusting the luminance of the fingerprint region 1510 based on the conversion offset, and performing fingerprint authentication by using the fingerprint sensor 312 while the display panel 330 displays an image in which the luminance of the fingerprint region 1510 is adjusted.

According to an embodiment, the method may include lowering grayscale values of data supplied to pixels of the fingerprint region 1510 based on the conversion offset.

According to an embodiment, the method may include lowering the luminance of the fingerprint region 1510 based on the conversion offset through mask processing applied only to the fingerprint region 1510 of a frame image supplied to the display panel 330.

According to an embodiment, the method may further include: accumulating and storing data about images in which the luminance of the fingerprint region 1510 is adjusted; and determining compensation data for compensating for burn-in of the display panel 330 based on the accumulated data.

According to an embodiment, the method may include changing, when the fingerprint authentication function is executed, the luminance setting value of the fingerprint region 1510 based on the overall luminance of the display panel 330 and the luminance of the surrounding region. "Based on" as used herein covers based at least on.

According to an embodiment, the method may include: controlling the fingerprint region 1510 to output a first luminance in case of a first state where the overall luminance of the display panel 330 is less than or equal to a third reference luminance and the luminance of the surrounding region is greater than a fourth reference luminance; controlling the fingerprint region 1510 to output a maximum luminance in case of a second state where the overall luminance of the display panel 330 is greater than the third reference luminance and the luminance of the surrounding region is greater than the fourth reference luminance; controlling the fingerprint region 1510 to output a second luminance lower than the first luminance in case of a third state where the overall luminance of the display panel 330 is less than or equal to the third reference luminance and the luminance of the surrounding region is less than or equal to the fourth reference luminance; and controlling the fingerprint region 1510 to output the first luminance in case of a fourth state where the overall luminance of the display panel 330 is greater than the third reference luminance and the luminance of the surrounding region is less than or equal to the fourth reference luminance.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device comprising:
a display panel;
a fingerprint sensor disposed to overlap at least a portion of the display panel; and
a processor operably connected to the display panel and the fingerprint sensor,
wherein the processor is configured to:
execute a fingerprint authentication function using the fingerprint sensor;
identify an AMOLED off ratio (AOR) and luminance setting value of the display panel based on execution of the fingerprint authentication function;
adjust the AOR linearly and/or set the AOR to a specified value based on a section to which the luminance setting value belongs; and
perform fingerprint authentication by using at least the fingerprint sensor while the AOR is maintained at the specified value.

2. The electronic device of claim 1, wherein the specified value is a specified minimum value, and wherein the processor is configured to:
lower the AOR linearly from a specified maximum value to the minimum value in a case that the luminance setting value belongs to a first section being less than a first reference luminance when the fingerprint authentication function is executed;
lower the AOR linearly to the minimum value in a case that the luminance setting value belongs to a second section being greater than the first reference luminance and less than a second reference luminance when the fingerprint authentication function is executed, the second reference luminance being greater than the first reference luminance; and
maintain the AOR at the minimum value in a case that the luminance setting value belongs to a third section being greater than the second reference luminance when the fingerprint authentication function is executed.

3. The electronic device of claim 2, wherein:
the first section is a normal brightness section where a brightness setting of the display panel is to be adjusted based on user input; and
the second section and the third section are each a section where a user is not allowed to adjust the brightness setting of the display panel based on user input and are each a high brightness mode (HBM) section where the electronic device is configured to automatically adjust a brightness of the display panel by using at least an illuminance sensor.

4. The electronic device of claim 1, wherein the processor is configured to perform user authentication by using at least one piece of data generated as light output through the display panel is reflected by a user's finger while the AOR is maintained at the specified value.

5. The electronic device of claim 1, wherein:
the display panel includes a fingerprint region overlapping at least a portion of the fingerprint sensor and a surrounding region disposed to surround the fingerprint region; and
the processor is configured so that when the fingerprint authentication function is executed, the processor is configured to identify the luminance setting value of the display panel and a luminance of the surrounding region, determine a conversion offset based on the luminance setting value and the luminance of the surrounding region, adjust a luminance of the fingerprint region based on the conversion offset, and perform fingerprint authentication by using at least the fingerprint sensor while the display panel displays an image in which the luminance of the fingerprint region is adjusted.

6. The electronic device of claim 5, wherein the processor is configured to directly lower grayscale values of data supplied to pixels of the fingerprint region based on the conversion offset.

7. The electronic device of claim 5, wherein the processor is configured to lower the luminance of the fingerprint region based on the conversion offset through mask processing applied only to the fingerprint region of a frame image supplied to the display panel.

8. The electronic device of claim 5, wherein the processor is configured to:
accumulate and store data about images in which the luminance of the fingerprint region is adjusted; and
determine compensation data for compensating for burn-in of the display panel based on the accumulated data.

9. The electronic device of claim 5, wherein, when the fingerprint authentication function is executed, the processor is configured to change a luminance setting value of the fingerprint region based on an overall luminance of the display panel and a luminance of the surrounding region.

10. The electronic device of claim 9, wherein, when the fingerprint authentication function is executed, the processor is configured to:
control the fingerprint region to output a first luminance in a case of a first state where the overall luminance of the display panel is less than or equal to a third reference luminance and the luminance of the surrounding region is greater than a fourth reference luminance;

control the fingerprint region to output a maximum or high luminance in a case of a second state where the overall luminance of the display panel is greater than the third reference luminance and the luminance of the surrounding region is greater than the fourth reference luminance;

control the fingerprint region to output a second luminance lower than the first luminance in a case of a third state where the overall luminance of the display panel is less than or equal to the third reference luminance and the luminance of the surrounding region is less than or equal to the fourth reference luminance; and control the fingerprint region to output the first luminance in a case of a fourth state where the overall luminance of the display panel is greater than the third reference luminance and the luminance of the surrounding region is less than or equal to the fourth reference luminance.

11. A method for an electronic device including a fingerprint sensor disposed to overlap at least a portion of a display panel, the method comprising:

executing a fingerprint authentication function using the fingerprint sensor of the electronic device;

identifying an AMOLED off ratio (AOR) and luminance setting value of the display panel in response to execution of the fingerprint authentication function;

adjusting the AOR linearly and/or setting the AOR to a specified minimum value according to a section to which the luminance setting value belongs; and performing fingerprint authentication by using at least the fingerprint sensor while the AOR is maintained at the minimum value.

12. The method of claim 11, comprising:

lowering the AOR linearly from a specified maximum value to the minimum value in a case that the luminance setting value belongs to a first section less than a first reference luminance when the fingerprint authentication function is executed;

lowering the AOR linearly to the minimum value in a case that the luminance setting value belongs to a second section greater than the first reference luminance and less than or equal to a second reference luminance when the fingerprint authentication function is executed, the second reference luminance being greater than the first reference luminance; and maintaining the AOR at the minimum value in a case that the luminance setting value belongs to a third section greater than the second reference luminance when the fingerprint authentication function is executed.

13. The method of claim 12, wherein:

the first section is a normal brightness section where a brightness setting of the display panel is to be adjusted based on user input; and the second section and the third section are each a section where a user is not allowed to adjust the brightness setting of the display panel based on user input and are each a high brightness mode (HBM) section where the electronic device automatically adjusts a brightness of the display panel by using an illuminance sensor.

14. The method of claim 11, comprising performing user authentication by using at least one piece of data generated as light output through the display panel is reflected by a user's finger while the AOR is maintained at the minimum value.

15. The method of claim 11, wherein the display panel includes a fingerprint region overlapping at least a portion of the fingerprint sensor and a surrounding region disposed to surround the fingerprint area, the method further comprising:

identifying the luminance setting value of the display panel and a luminance of the surrounding region when the fingerprint authentication function is executed;

determining a conversion offset based on the luminance setting value and the luminance of the surrounding region;

adjusting a luminance of the fingerprint region based on the conversion offset; and performing fingerprint authentication by using the fingerprint sensor while the display panel displays an image in which the luminance of the fingerprint region is adjusted.

16. The method of claim 15, comprising lowering grayscale values of data supplied to pixels of the fingerprint region based on the conversion offset.

17. The method of claim 15, comprising lowering the luminance of the fingerprint region based on the conversion offset through mask processing applied only to the fingerprint region of a frame image supplied to the display panel.

18. The method of claim 15, further comprising:

accumulating and storing data about images in which the luminance of the fingerprint region is adjusted; and determining compensation data for compensating for burn-in of the display panel based on the accumulated data.

19. The method of claim 15, comprising changing, when the fingerprint authentication function is executed, a luminance setting value of the fingerprint region based on an overall luminance of the display panel and the luminance of the surrounding region.

20. The method of claim 11, further comprising, when the fingerprint authentication function is executed:

controlling the fingerprint region to output a first luminance in case of a first state where the overall luminance of the display panel is less than or equal to a third reference luminance and the luminance of the surrounding region is greater than a fourth reference luminance;

controlling the fingerprint region to output a maximum luminance in case of a second state where the overall luminance of the display panel is greater than the third reference luminance and the luminance of the surrounding region is greater than the fourth reference luminance;

controlling the fingerprint region to output a second luminance lower than the first luminance in case of a third state where the overall luminance of the display panel is less than or equal to the third reference luminance and the luminance of the surrounding region is less than or equal to the fourth reference luminance; and controlling the fingerprint region to output the first luminance in case of a fourth state where the overall luminance of the display panel is greater than the third reference luminance and the luminance of the surrounding region is less than or equal to the fourth reference luminance.

* * * * *